United States Patent
Balakrishnan et al.

(10) Patent No.: US 11,695,602 B2
(45) Date of Patent: Jul. 4, 2023

(54) FILTERED COARSE MIXER BASED DIGITAL DOWN-CONVERTER FOR RF SAMPLING ADCS

(71) Applicant: Texas Instruments Incorporated, Dallas, TX (US)

(72) Inventors: Jaiganesh Balakrishnan, Bengaluru (IN); Nagalinga Swamy Basayya Aremallapur, Ranebennur (IN); Aswath Vs, Kannur (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/538,460

(22) Filed: Nov. 30, 2021

(65) Prior Publication Data

US 2022/0173947 A1 Jun. 2, 2022

(30) Foreign Application Priority Data

Dec. 1, 2020 (IN) .............................. 202041052384

(51) Int. Cl.
*H04L 27/14* (2006.01)
(52) U.S. Cl.
CPC .................................. *H04L 27/14* (2013.01)
(58) Field of Classification Search
CPC ..................................................... H04L 27/14
See application file for complete search history.

(56) References Cited

U.S. PATENT DOCUMENTS 10,666,293 B2    5/2020  Tangudu et al.
2002/0037060 A1* 3/2002 Kishi ...................... H04L 27/08
                                                        375/345

* cited by examiner

Primary Examiner — Rahel Guarino
(74) Attorney, Agent, or Firm — Valerie M. Davis; Frank D. Cimino

(57) ABSTRACT

A digital down converter (DDC) that improves efficiency by taking advantage of the periodicity of the coarse mixing process and the memory inherent in the convolution operation performed by decimation filters. In embodiments, the DDC filters and decimates a received signal to generate subfilter outputs and coarse mixes the subfilter outputs for each frequency band of interest. Accordingly, the DDC eliminates the need for separate decimation filters for each of the in-phase (I-phase) and quadrature (Q-phase) signals of each frequency band. In some embodiments, for each frequency band, the DDC combines the subfilter outputs into partial sums for each of the I- and Q-phases. In some of those embodiments, the coarse mixing operation is performed by multiplying the partial sums by real multiplicands and performing a simple post-rotation operation. In those embodiments, the DDC significantly reduces the number of multiplication operations required to perform the coarse mixing process.

21 Claims, 20 Drawing Sheets

US 11,695,602 B2

FILTERED COARSE MIXER BASED DIGITAL DOWN-CONVERTER FOR RF SAMPLING ADCS

CROSS-REFERENCE TO RELATED APPLICATIONS

This application claims priority to India Provisional Application No. 202041052384, filed Dec. 1, 2020, which is hereby incorporated by reference.

BACKGROUND

Down converters transform a radio frequency (RF) signal into a baseband signal centered at the zero frequency. Down conversion has traditionally been performed in the analog domain. In RF sampling, however, the RF signal is directly sampled with a high speed, high performance analog to digital converter (ADC), avoiding the need for mixers in the analog domain. Signals in multiple frequency bands of interest may then be received using a single RF/analog receiver chain by employing a digital down-converter (DDC) that down-converts the signal by the center frequency of one of the frequency bands of interest.

Some prior art DDCs (e.g., as described in U.S. Pat. No. 10,666,293, which is hereby incorporated herein in its entirety, improve efficiency by mixing the received signal by a coarse frequency, reducing the sampling rate of the coarse-mixed signal, and shifting the frequency of the coarse-mixed signal by a residual amount. By selecting a coarse frequency that is proportional to the sampling rate, coarse mixing the received signal reduces the complexity of the multiplication operations that must be performed at the sampling rate of the received signal. However, in those prior art DDCs, reducing the sampling rate of the coarse-mixed signal requires a decimation filter for both the in-phase (I-phase) and quadrature (Q-phase) components for each frequency band of interest. Furthermore, coarse mixing the received signal still requires multiplication by a number of complex phasors.

SUMMARY

In some embodiments, a digital down converter (DDC) is disclosed that improves efficiency by taking advantage of the periodicity of the coarse mixing process and the memory inherent in the convolution operation performed by the decimation filters. In some embodiments, the DDC includes a modified decimate-by-N filter that filters and decimates a received signal before coarse mixing the filtered and decimated signal for each frequency band of interest. By filtering and decimating the input signal by N before performing the coarse mixing operation for each frequency band of interest, the modified decimate-by-N filter eliminates the need for a decimation filter for both the in-phase (I-phase) and quadrature (Q-phase) components for each frequency band of interest.

In some embodiments, the modified decimate-by-N filter includes M subfilters that each generate a subfilter output for every N input samples. In some of those embodiments, for each frequency band of interest, the DDC combines the M subfilter outputs into P=M/4 partial sums for each of the I- and Q-phases. In some of those embodiments, the coarse mixing operation can be performed by multiplying the partial sums by real multiplicands and performing a simple post-rotation operation. Accordingly, in those embodiments, the DDC significantly reduces the number of multiplication operations required to perform the coarse mixing process.

BRIEF DESCRIPTION OF THE DRAWINGS

For a detailed description of various examples, reference will now be made to the accompanying drawings in which.

The same reference numbers and other reference designators are used in the drawings to depict the same or similar (functionally and/or structurally) features.

DETAILED DESCRIPTION

Figure 1A:
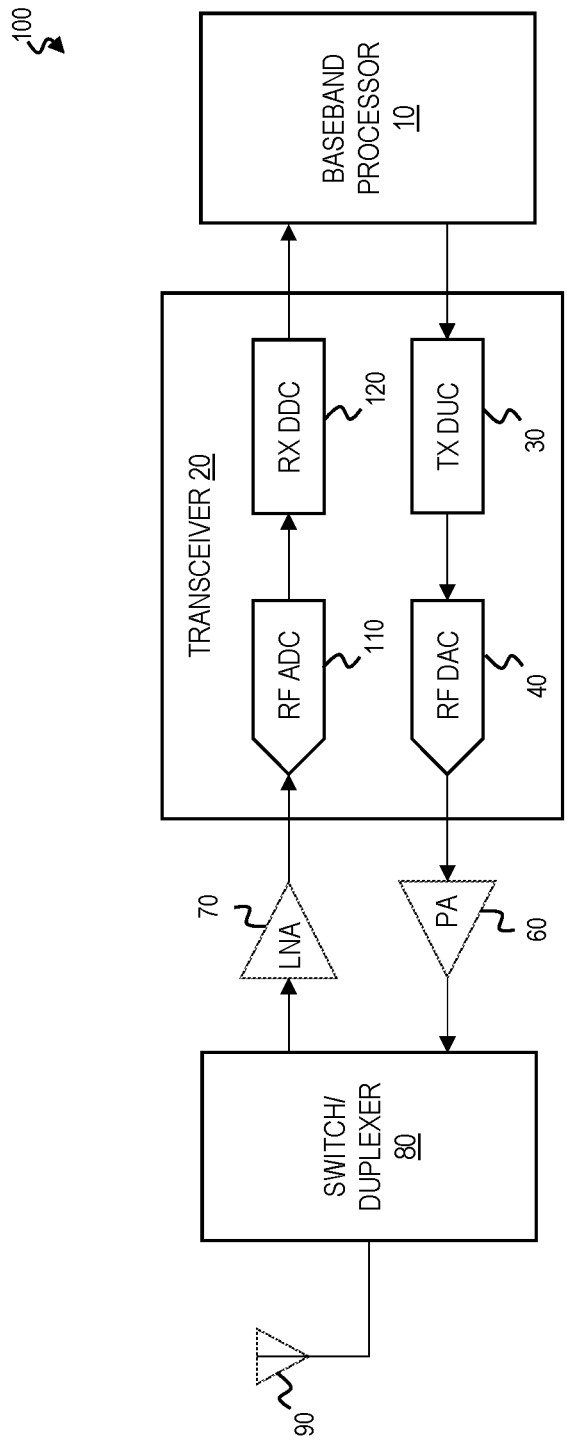
FIG. 1A is a block diagram of a prior art transceiver chain.

FIG. 1A is a block diagram of a prior art transceiver chain 100. In the embodiment of FIG. 1A, the transceiver chain 100 includes a baseband processor 10, a radio frequency (RF) sampling transceiver 20, a power amplifier (PA) 60, a low noise amplifier (LNA) 70, a switch/duplexer 80, and an RF port 90 (e.g., an antenna). The transceiver 20 has a receive signal path that includes an RF analog-to-digital converter (ADC) 110 coupled to a receive (RX) digital down-converter (DDC) 120. The transceiver 20 also has a transmit signal path that includes an RF digital-to-analog converter (DAC) 40 coupled to a transmit (TX) digital up-converter (DUC) 30.

The baseband processor 10 may be implemented as an application-specific integrated circuit (ASIC) or a field-programmable gate array (FPGA) and may include digital signal processors, microprocessors, microcontrollers and/or other types of signal processing hardware and/or software.

The transceiver 20 may be implemented using multiple semiconductor devices (e.g. devices on different semiconductor die or packaged in different semiconductor device packages) or may be part of an integrated transceiver with the ADC 110, DDC 120, DAC 40, and DUC 30 integrated on a single semiconductor die. The integrated transceiver 20 may be implemented on the same semiconductor die (or in the same semiconductor device package) as the baseband processor 10.

To transmit signals, the baseband processor 10 provides baseband transmit signals to the DUC 30. The DUC 30 up-converts the baseband transmit signals provided by baseband processor 10 to a higher frequency and provides those higher frequency transmit signals to the DAC 40. The DAC 40 converts the higher frequency transmit signals received from the DUC 30 to an analog representation and provides those analog transmit signals to the power amplifier 60. The power amplifier 60 amplifies the analog transmit signals received from the DAC 40 and provides those amplified analog transmit signals to the switch/duplexer 80. The switch/duplexer 80 provides the amplified analog transmit signals received from the power amplifier 60 to the RF port 90 for transmission via an antenna (or, in other example embodiments, any type of communications mediums, such as cables, buses or optical cables).

The RF port 90 also receives RF signals via the antenna or communications medium and provides those received RF signals to the low noise amplifier 70 via the switch/duplexer 80. The low noise amplifier 70 amplifies the received RF signals provided by the RF port 90 and provides those amplified receive signals to the ADC 110. The ADC 110 converts the amplified receive signals provided by the low noise amplifier 70 to a digital representation and provides those digital receive signals to the DDC 120. The DDC 120 converts the digital receive signals provided by the ADC 110 to a baseband frequency and provides those baseband frequency receive signals to the baseband processor 10, which processes the baseband frequency receive signals.

Figure 1B:
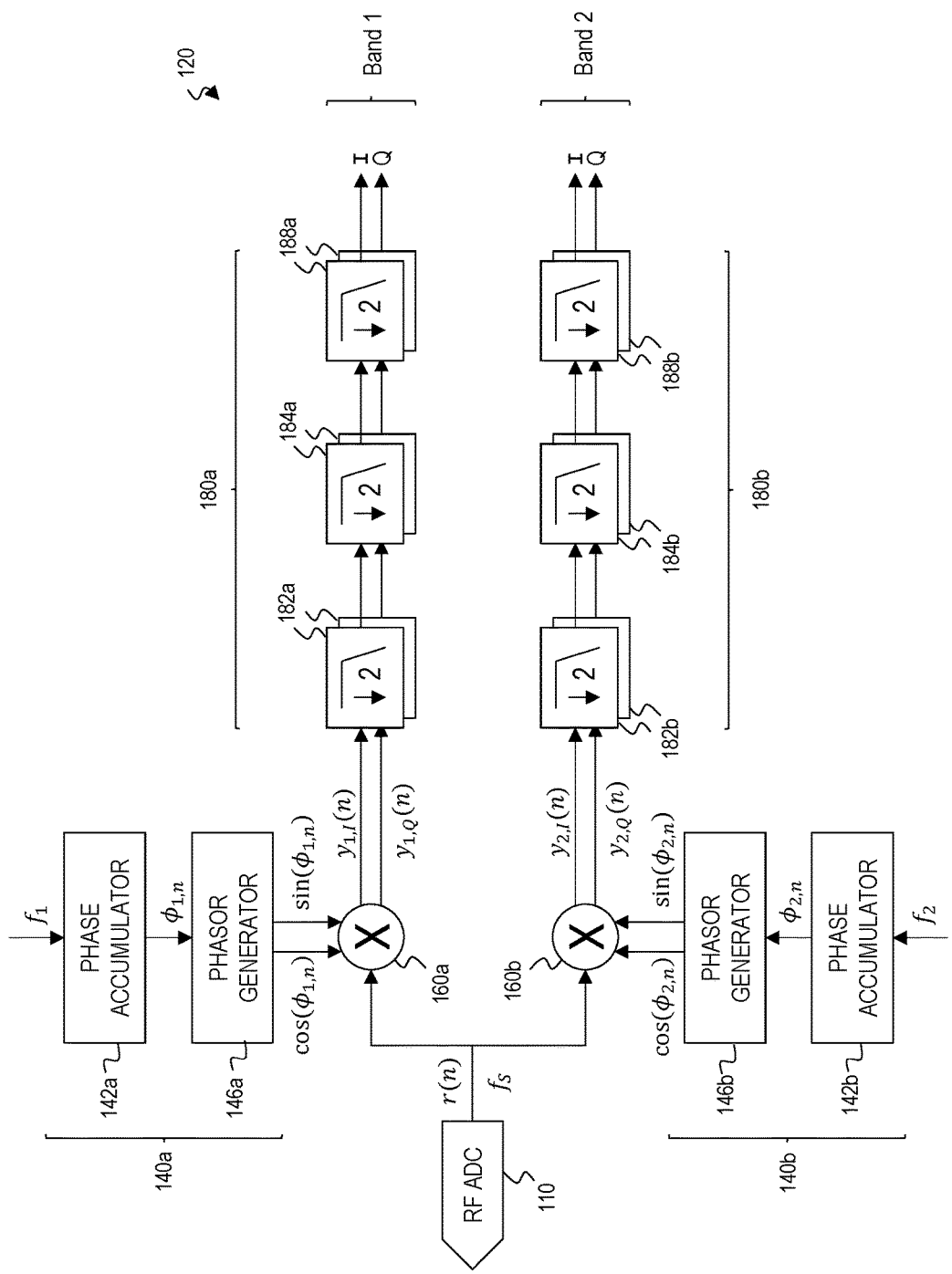
FIG. 1B is a block diagram of a prior art single-stage digital down-converter (DDC)

FIG. 1B is a block diagram of a prior art single-stage DDC 120.

In the embodiment of FIG. 1B, the DDC 120 is a dual-band digital down-converter that receives a digital signal r(n) from the ADC 110 at a sampling rate of $f_s$. The signal r(n) received from the ADC 110 has two desired signal components in two frequency bands centered around two center frequencies $f_1$ and $f_2$. For each of the two frequency bands, the DDC 120 includes single-stage mixers 160a and 160b (individually and collectively referred to as single-stage mixers 160) that each down-converts the received signal in the frequency band centered around $f_1$ or $f_2$ to a frequency band centered around 0 Hertz (DC). The DDC 120 includes low-pass filters 180a and 180b (individually and collectively referred to as low-pass filters 180) that each filter the down-converted signal for one of the two frequency bands and decimate it to a lower sampling rate. In the embodiment of FIG. 1B, the low-pass filter 180a of the first band includes a series of three low-pass decimate-by-2 filters 182a, 184a, and 188a and the low-pass filter 180b for the second band includes a series of three low-pass decimate-by-2 filters 182b, 184b, and 188b.

Each single-stage mixer 160a and 160b generates an in-phase signal (an I-phase signal) by mixing the signal r(n) received from the ADC 110 with a cosine waveform and generates a quadrature signal (a Q-phase signal) by mixing the signal received from the ADC 110 with a sine waveform.

The outputs $y_{1,I}$ and $y_{2,Q}$ of the single-stage mixer 160a for the first band (centered around $f_1$) are shown in equations 1 and 2:

$$y_{1,I}(n) = r(n)\cos(2\pi f_1 n) \quad (1)$$

$$y_{1,Q}(n) = r(n)\sin(-2\pi f_1 n) \quad (2)$$

where r(n) is the signal received from the ADC 110 and n is an integer value that represents the sample index of the ADC 110. The outputs $y_{2,I}$ and $y_{2,Q}$ of the single-stage mixer 160b for the second band (centered around $f_2$) are shown in equations 3 and 4:

$$y_{2,I}(n) = r(n)\cos(2\pi f_2 n) \quad (3)$$

$$y_{2,Q}(n) = r(n)\sin(-2\pi f_2 n) \quad (4)$$

To generate the sine and cosine waveforms for each frequency band, the DDC 120 includes phasor generation circuitry 140a and 140b (individually and collectively referred to as phasor generation circuitry 140). In the embodiment of FIG. 1A, the phasor generation circuitry 140a for the first band includes a phase accumulator 142a and a phasor generator 146a and the phasor generation circuitry 140b for the second band includes a phase accumulator 142b and a phasor generator 146b. For each input sample r(n) received from the ADC 110, the phase accumulator 142a updates the phase $\phi_{n,1}$ for the first band as shown in equation 5 and the phase accumulator 142b updates the phase $\phi_{n,2}$ for the second band as shown in equation 6:

$$\phi_{1,n} = \mathrm{mod}(\phi_{1,n-1} - 2\pi f_1, 2\pi) \quad (5)$$

$$\phi_{2,n} = \mathrm{mod}(\phi_{2,n-1} - 2\pi f_2, 2\pi) \quad (6)$$

where $f_1$ is the normalized frequency of the first band (the absolute frequency $f_1$ of the first band divided by the sampling rate $f_s$), $f_2$ is the normalized frequency of the second band (the absolute frequency $f_2$ of the second band divided by the sampling rate $f_s$), and mod is a modulo operation (because the phase value $\phi$ is always within the range between 0 and $2\pi$). The phase accumulator 142a for the first band outputs the updated phase $\phi_{1,n}$ to the phasor generator 146a, which calculates $\cos(\phi_{1,n})$ and $\sin(\phi_{1,n})$ for the single-stage mixer 160a. The phase accumulator 142b for the second band outputs the updated phase $\phi_{2,n}$ to the phasor generator 146b, which calculates $\cos(\phi_{2,n})$ and $\sin(\phi_{2,n})$ for the single-stage mixer 160b. By mixing the signal received from the ADC 110 with the cosine and sine waveforms calculated using the center frequency $f_1$ of the first band, the single-stage mixer 160a down-converts the signal in the first frequency band to DC. By mixing the signal received from the ADC 110 with the cosine and sine waveforms calculated using the center frequency $f_2$ of the second band, the single-stage mixer 160b down-converts the signal in the second frequency band to DC.

While the single-stage DDC 120 advantageously alleviates the need for analog mixers, the single-stage DDC 120 of FIG. 1B is subject to a variety of disadvantages. Because the ADC 110 provides data to the DDC 120 at giga-sample per second (GSPS) rates, the digital circuitry needed to implement down conversion at such rates using the single-stage mixers 160a and 160b is complex and consumes a significant amount of power. For example, for each sample generated by the ADC 110, each phase generator 146a and 146b must perform a cosine computation as described above and each single-stage mixer 160a and 160b must perform two multiplication operations. The complexity of cosine and sine computation can be prohibitive due to the high precision requirement, for example a frequency resolution greater than 16-bit and spurious free dynamic range (SFDR) greater than 96 decibels relative to the carrier (dBc). Dual band operation doubles power consumption of the DDC 120. Consequently, power consumption of the DDC 120 of FIG. 1B can be very high, for example hundreds of milliwatts (mW) per channel.

Figure 2:
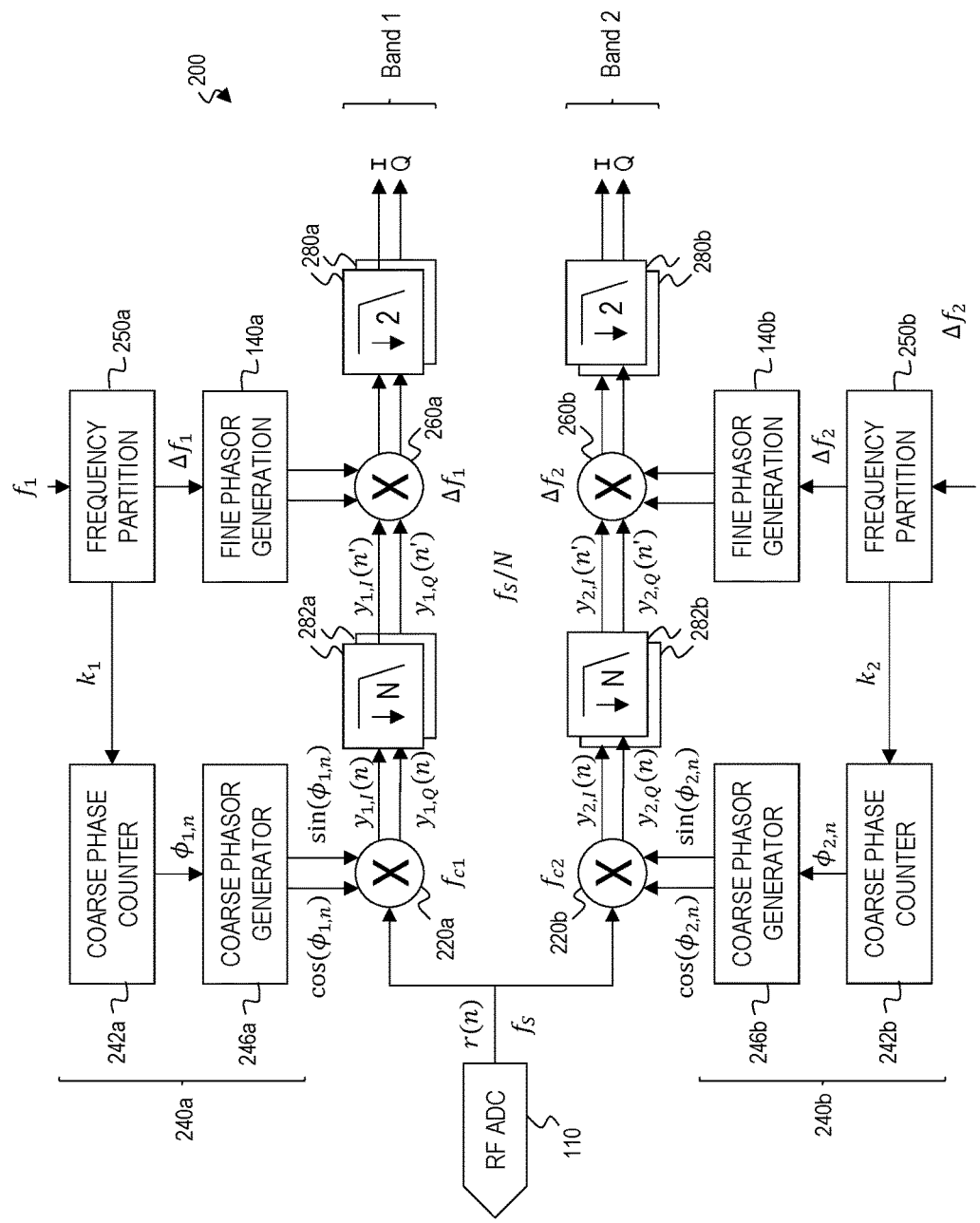
FIG. 2 is a block diagram illustrating a prior art two-stage DDC.

FIG. 2 is a block diagram illustrating a prior art two-stage DDC 200. In the embodiment of FIG. 2, the DDC 200 is a dual-band digital down-converter that receives a digital signal from the ADC 110 with two desired signal components in two frequency bands centered around two center frequencies $f_1$ and $f_2$.

For the first frequency band, the two-stage DDC 200 includes a low resolution coarse mixer 220a, two decimation filters 282a (one for each of the I and Q signals output by the coarse mixer 220a), a high resolution fine mixer 260a operating on the output of the decimation filters 282a, and frequency partitioning circuitry 250a. For the second frequency band, the two-stage DDC 200 includes a low resolution coarse mixer 220b, two decimation filters 282b (one for each of the I and Q signals output by the coarse mixer 220b), a high resolution fine mixer 260b operating on the output of the decimation filters 282b, and frequency partitioning circuitry 250b. In some embodiments, the DDC 200 also includes additional decimation filters 280a for the first frequency band and additional decimation filters 280b for the second frequency band. The low resolution coarse mixers 220a and 220b are individually and collectively referred to as coarse mixers 220, the decimation filters 282a and 282b are individually and collectively referred to as decimation filters 282, the high resolution fine mixers 260a and 260b are individually and collectively referred to as fine mixers 260, the frequency partitioning circuitry 250a and 250b are individually and collectively referred to as frequency partition circuitry 250 and the additional decimation filters 280a and 280b are individually and collectively referred to as additional decimation filters 280.

Each coarse mixer 220 operates at the sampling rate $f_s$ of the ADC 110 (e.g., 4 GSPS), each set of decimation filters 282 reduces that sampling rate by a factor of N (e.g., 4), and each fine mixer 260 operates at the reduced sampling rate $f_s/N$ (e.g., 1 GSPS).

The two-stage DDC 200 down-converts the signals in each frequency band to a frequency band centered around DC in a two-stage process performed by each low resolution coarse mixer 220 and high resolution fine mixer 260. For the first frequency band centered around $f_1$, for example, the coarse mixer 220a down-converts the signal by a frequency $f_{C1}$ selected by the frequency partitioning circuitry 250a. The fine mixer 260a shifts the down-converted signal by a residual amount $\Delta f_1$ that is equal to the difference between $f_1$ and $f_{C1}$. Together, the coarse mixer 220a and the fine mixer 260a down-convert the signal in the first frequency band (centered around $f_1$) to a frequency band centered around DC.

The coarse mixer 220a down-converts the signal received from the ADC 110 by a coarse frequency $f_{C1}$ that is equal to a multiple $k_1$ of the sampling frequency $f_s$ of the ADC 110 divided by an integer M (e.g., 16). To select the coarse frequency $f_{C1}$, the frequency partitioning circuitry 250a selects the integer $k_1$ wherein the coarse frequency $f_{C1}=k_1 f_s/M$ is closest to the center frequency $f_1$ of the first frequency band. Similarly, the frequency partitioning circuitry 250b for the second frequency band selects the integer $k_2$ wherein $f_{c2}=k_2 f_s/M$ is closest to the center frequency $f_2$ of the second frequency band. The coarse mixer 220b down-converts the signal received from the ADC 110 by the frequency $f_{C2}$ at the sampling rate $f_s$ of the ADC 110, the decimation filters 282b reduce that sampling rate by a factor of N, and the fine mixer 260b (operating at the reduced sampling rate $f_s/N$) shifts the down-converted signal by a residual amount $\Delta f_2$ that is equal to the difference between $f_2$ and $f_{C2}$.

To generate the sine and cosine waveforms for the coarse mixers 220a and 220b for each frequency band, the DDC 200 includes coarse phasor generation circuitry 240a and 240b (individually and collectively referred to as coarse phasor generation circuitry 240). In the embodiment of FIG. 2, the coarse phasor generation circuitry 240a for the first band includes a coarse phase accumulator 242a and a coarse phasor generator 246a and the coarse phasor generation circuitry 240b for the second band includes a coarse phase accumulator 242b and a coarse phasor generator 246b. The coarse phase accumulators 242a and 242b are individually and collectively referred to as coarse phase accumulators 242. The coarse phasor generators 246a and 246b are individually and collectively referred to as coarse phase accumulators 246.

For each input sample received from the ADC 110, the coarse phase accumulator 242a updates the phase $\phi_{1,n}$ for the first band as shown in equation 7 and the coarse phase accumulator 242b updates the phase $\phi_{2,n}$ for the second band as shown in equation 8:

$$\phi_{1,n}=\mathrm{mod}(\phi_{1,n-1}-2\pi f_{C1}, 2\pi) \quad (7)$$

$$\phi_{2,n}=\mathrm{mod}(\phi_{2,n-1}-2\pi f_{C2}, 2\pi) \quad (8)$$

where $f_{C1}$ is the normalized coarse frequency of the first band (the absolute coarse frequency $f_{C1}$ of the first band divided by the sampling rate $f_s$) and $f_{C2}$ is the normalized frequency of the second band (the absolute coarse frequency $f_{C2}$ of the second band divided by the sampling rate $f_s$). The coarse phase accumulator 242a for the first band outputs the updated phase $\phi_{1,n}$ to the coarse phasor generator 246a, which calculates $\cos(\phi_{1,n})$ and $\sin(\phi_{1,n})$ for the coarse mixer 220a. The coarse phase accumulator 242b for the second band outputs the updated phase $\phi_{2,n}$ to the phasor generator 146b, which calculates $\cos(\phi_{2,n})$ and $\sin(\phi_{2,n})$ for the coarse mixer 220b.

To generate the sine and cosine waveforms for the fine mixers 260a and 260b for each frequency band, the DDC 200 includes fine phasor generation circuitry 140a and 140b (individually and collectively referred to as fine phasor generation circuitry 140). Like the phasor generation circuitry 140 of the single-stage DDC 120, the fine phasor generation circuitry 140a updates the phase $\phi_{\Delta 1,n}$ for the first band as shown in equation 9 and the fine phasor generation circuitry 140b updates the phase $\phi_{\Delta 2,n}$ for the second band as shown in equation 10:

$$\phi_{\Delta 1,n}=\mathrm{mod}(\phi_{1,n-1}-2\pi\Delta f_1, 2\pi) \quad (9)$$

$$\phi_{\Delta 2,n}=\mathrm{mod}(\phi_{2,n-1}-2\pi\Delta f_2, 2\pi) \quad (10)$$

where $\Delta f_1$ is the difference between the absolute center frequency $f_1$ and the absolute coarse frequency $f_{C1}$ of the first band divided by the sampling rate $f_s/N$ and $\Delta f_2$ is the difference between the absolute center frequency $f_2$ and the absolute coarse frequency $f_{C2}$ of the second band divided by the sampling rate $f_s/N$. The fine phasor generation circuitry 140a calculates $\cos(\phi_{\Delta 1,n})$ and $\sin(\phi_{\Delta 1,n})$ for the fine mixer 260a and the fine phasor generation circuitry 140b calculates $\cos(\phi_{\Delta 2,n})$ and $\sin(\phi_{\Delta 2,n})$ for the fine mixer 260b.

The two-stage DDC 200 provides a number of benefits over the single-stage DDC 120. Down-converting by a multiple ($k_1$ or $k_2$) of $f_s/M$ significantly reduces the complexity of the cosine and sine calculations performed by the coarse phasor generators 246. As shown in equations 1 and 2 above, the outputs $y_{1,I}$ and $y_{1,Q}$ of the DDC 120 for the signal in the first band (centered around $f_1$) are $r(n) \cos(2\pi f_1 n)$ and $r(n) \sin(-2\pi f_1 n)$. In a sampling domain, time is an integer n provided by the ADC 110 divided by the sampling frequency $f_s$. Therefore, down-converting by $f_1$ requires the single-stage mixer 160 of the single-stage DDC 120 to calculate the cosine and sine of $f_1/f_s$ multiplied by an integer n. Because $f_1/f_s$ is a fraction, those sine and cosine operations are complex. By contrast, the coarse mixer 220a can down-convert a signal with a frequency $f_1$ of 1.8 gigahertz (GHZ) by a nearby coarse frequency $f_{C1}$ of 1.75 GHz, which is 7 times the sampling frequency $f_s$ divided by 16 (or $k_1 f_s/M$ where $k_1$ is 7, $f_s$ is 4 GSPS, and M is 16). As a result, as described below with reference to FIGS. 3A and 3B, the phase shift performed by the coarse mixers 220 is limited to one of M values. In embodiments where M is 16, for example, each phase shift performed by each coarse mixer 220 is limited to a multiples of 360°/M (i.e., 22.5°, 45°, 67.5°, 90°, etc.).

Because each coarse phasor generator 246 performs only M sine and cosine calculations, the overhead of each coarse phasor generator 246 is small. In some embodiments, each coarse phasor generator 246 can perform that limited number of sine and cosine calculations using a small look-up table. Additionally, because there are a limited number of sine and cosine values that need to be multiplied, in some implementations, each coarse mixer 220 may be implemented using fixed coefficient multipliers. Therefore, even operating at the sampling rate of the ADC 110 (e.g., 4 GSPS), the overhead of the coarse mixer 220 is low. Meanwhile, because the fine mixers 260 of the two-stage DDC 200 operate at one-fourth the sampling rate of the single-stage mixers 160 of the single-stage DDC 120 (when the decimation filters 282 decimate by 4), the digital complexity and power consumption of the sine/cosine generation and multiplication operations performed by the fine mixers 260 of the two-stage DDC 200 are lower than those operations performed by the single-stage mixers 160 of the single-stage DDC 120.

The complex output $x_i(n)$ of each coarse mixer 220 is shown in equation 11:

$$x_i(n) = r(n) * \exp\left(\frac{-j2\pi k_i n}{M}\right) \qquad (11)$$

where $r(n)$ is the input received from the ADC 110, $k_i$ is the frequency index of the frequency band, and $$\exp\left(\frac{-j2\pi k_i n}{M}\right)$$

is the complex phasor.

Figures 3A, 3B:
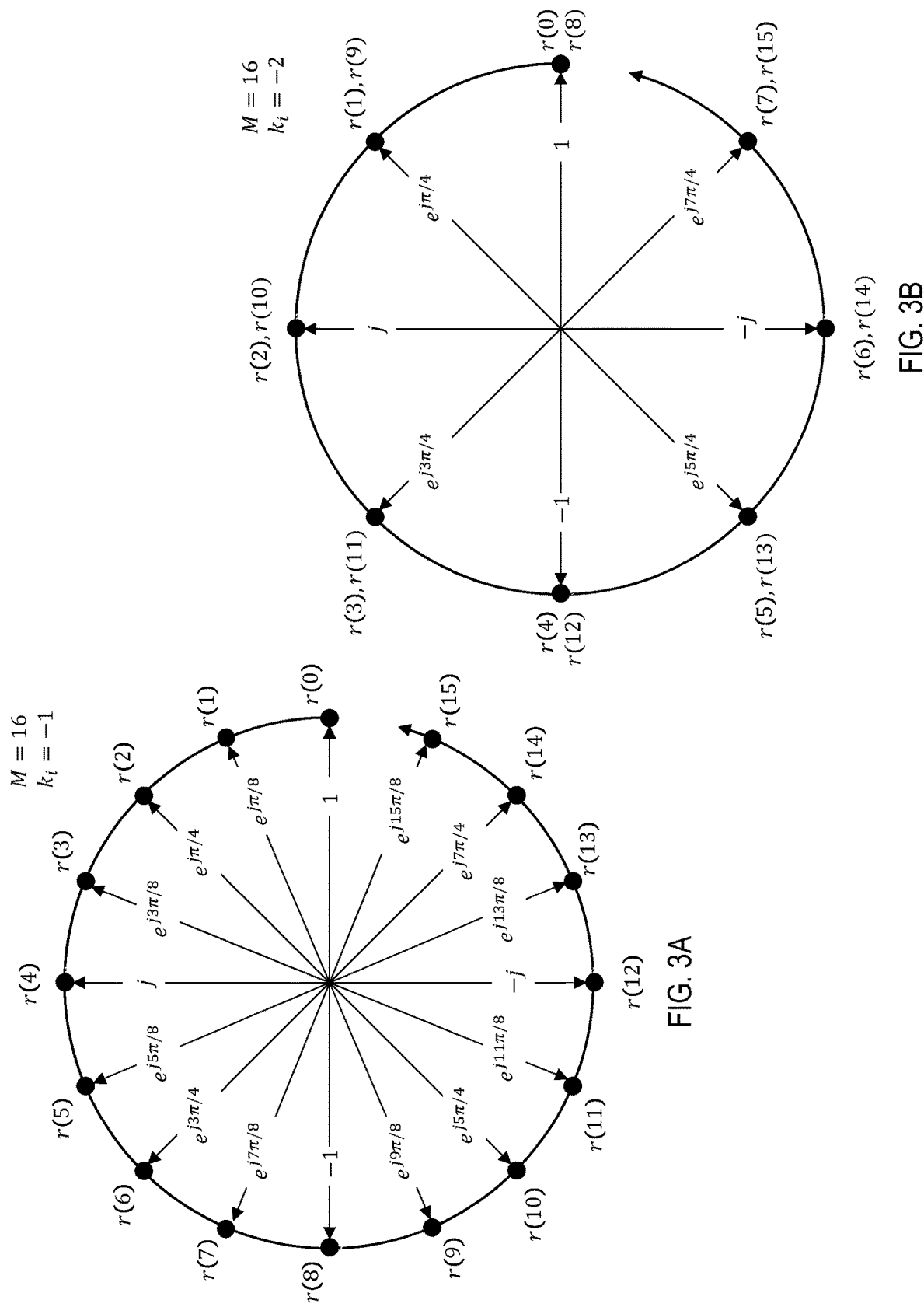
FIG. 3A is a unit circle depicting the complex phasors for a coarse mixer where the frequency index is −1.
FIG. 3B is a unit circle depicting the complex phasors for a coarse mixer where the frequency index is −2.

FIG. 3A is a unit circle depicting the complex phasors $\phi$ for a coarse mixer 220 where the frequency index $k_i$ is −1 and M is 16. FIG. 3B is a unit circle depicting the complex phasors $\phi$ for a coarse mixer 220 where M is 16 and the frequency index $k_i$ is −2. As shown in FIGS. 3A and 3B, at most, the coarse mixer 220 only needs to perform M sine and cosine operations.

Figure 4:
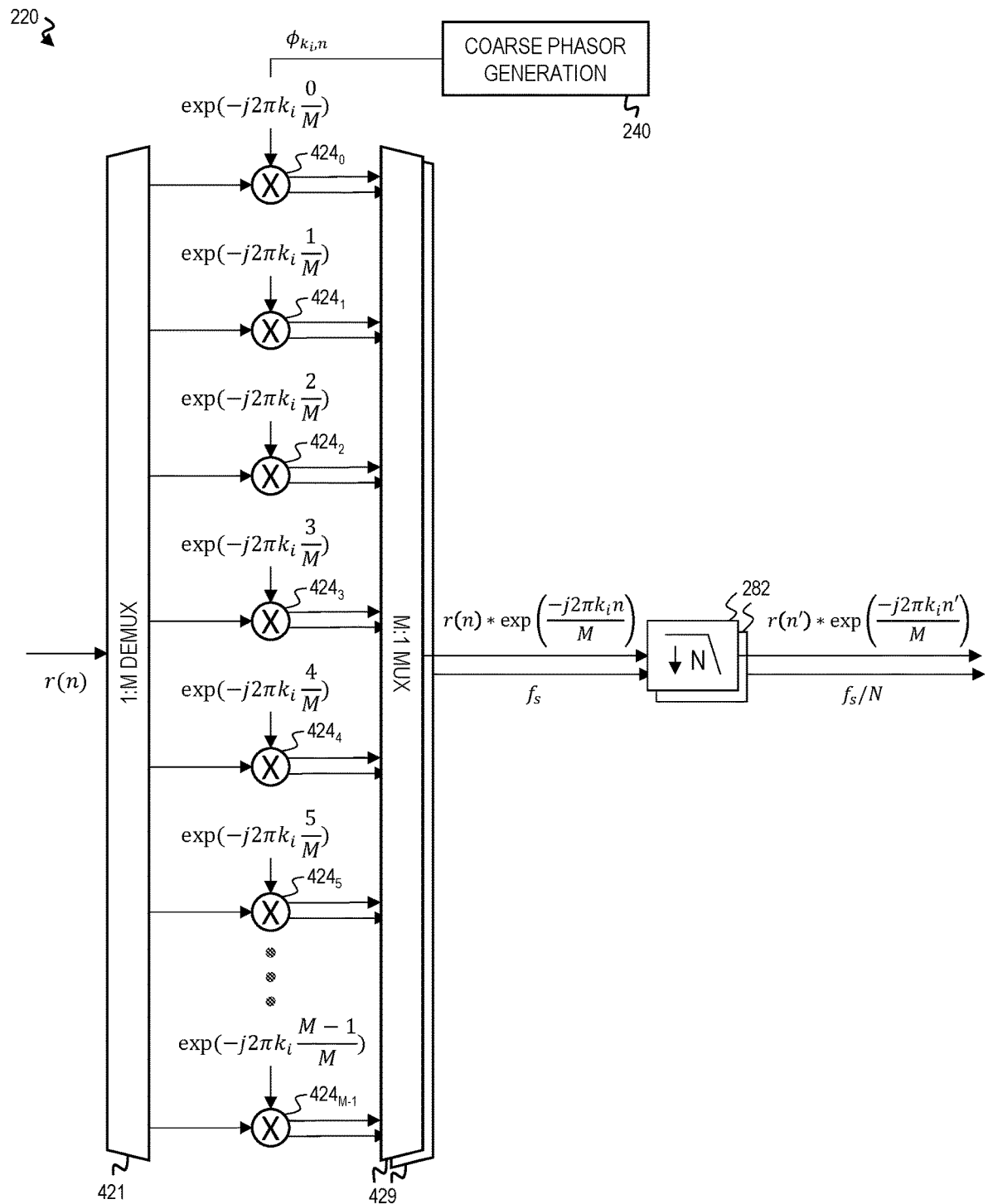
FIG. 4 is a circuit diagram of an example coarse mixer.

FIG. 4 is a diagram of an example coarse mixer 220. As shown in FIG. 3A, each coarse mixer 220 multiplies each input sample $r(n)$ received from the ADC 110 by one of only M complex phasors. Accordingly, in the embodiment of FIG. 4, the coarse mixer 220 includes a 1:M demultiplexer (DEMUX) 421 having an input that receives the input samples $r(n)$ and M outputs coupled to M mixers $424_0$ through $424_{M-1}$ (individually and collectively referred to as mixers 424). One of the M mixers 424 mixes the input sample $r(n)$ with the phasor $\phi_{k_i,n}$ (output by the coarse phasor generation circuitry 240) for the frequency index $k_i$ (selected by the frequency partition circuitry 250) and the sample index n of the input sample $r(n)$. As mentioned above, the selected mixer 424 generates both an I-phase signal (by mixing the input sample $r(n)$ with the cosine of $\phi_{k_i,n}$) and a Q-phase signal (by mixing the input sample $r(n)$ with the sine of $\phi_{k_i,n}$). In the embodiment of FIG. 4, each mixer 424 is coupled to two multiplexers (MUX) 429 (one for each of the I- and Q-phase signals). Each multiplexer (MUX) 429 combines and outputs the down-sampled (I-phase or Q-phase) signal to one of the decimation filters 282. As mentioned above, the coarse mixer 220 operates at the sampling rate $f_s$ of the ADC 110 and the decimation filters 282 reduce that sampling rate by a factor of N and output the down-converted and decimated signal to the fine mixer 260 for that frequency band.

As described above with reference to FIG. 2, the digital complexity and power consumption of two-stage DDC 200 is lower than those operations performed by the single-stage DDC 120. However, just like the single-stage DDC 120, the two-stage DDC 200 requires two decimation filters 282 for each frequency band, which adds to the complexity and cost of the two-stage DDC 200.

Figure 5A:
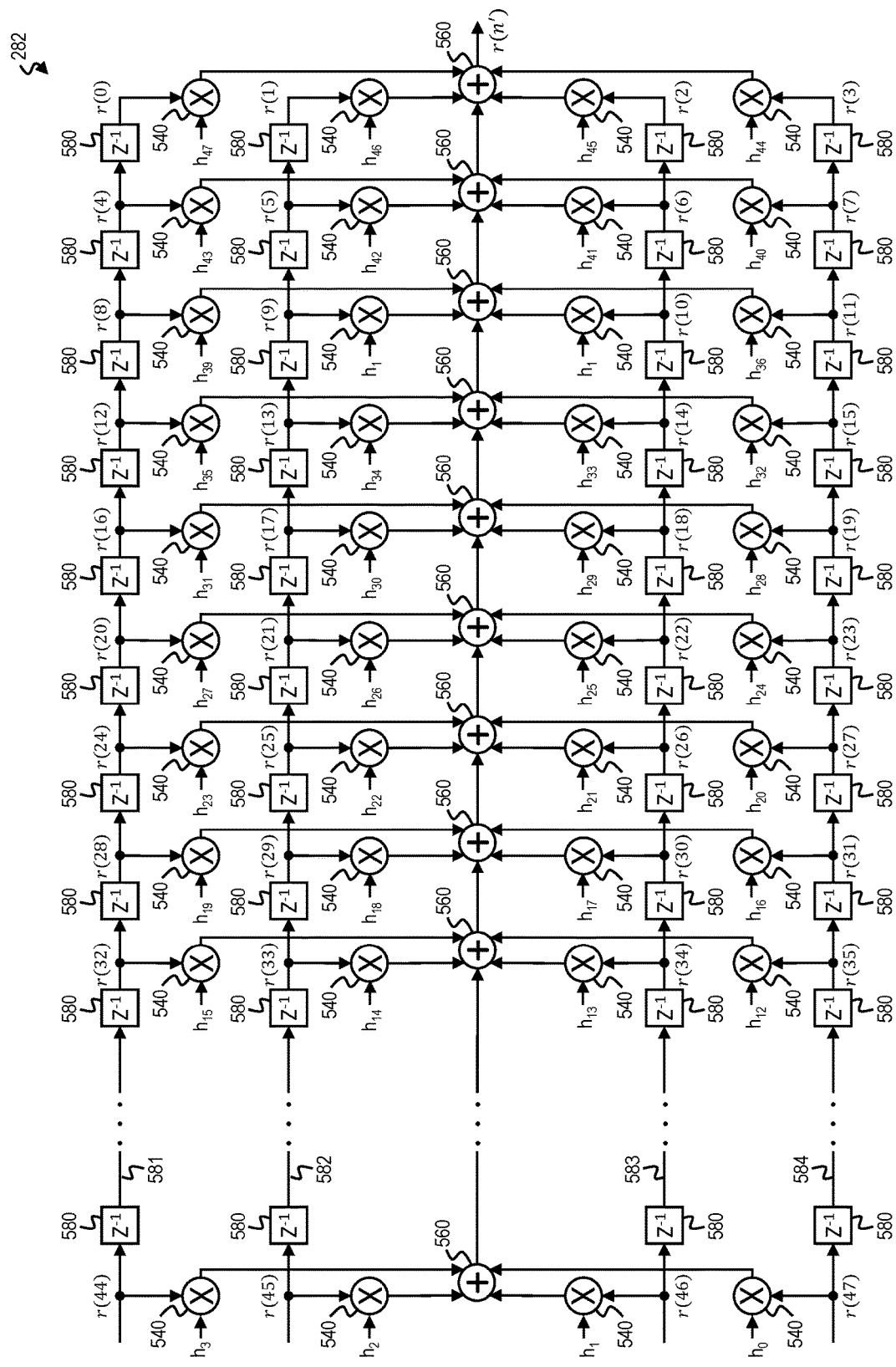
FIG. 5A is a circuit diagram of a prior art decimation filter.

FIG. 5A is a diagram of an example decimation filter 282. In the example of FIG. 5A, the decimation filter 282 is a multi-stage, finite impulse response (FIR) decimate-by-4 filter that filters input samples $r(n)$ and outputs one filtered output sample $r(n')$ for every four input samples $r(n)$. As described below, the decimation filter 282 filters the input samples $r(n)$ by multiplying an array of the most recent input samples $r(n)$ by an array of filter coefficients $h_l$ and summing the elements of the resulting array. In the example of FIG. 5A, the decimation filter 282 has a length L of 48, meaning the input samples $r(n)$ are filtered by 48 filter coefficients $h_l$ (where l is each integer between 0 and 47).

In the example of FIG. 5A, the decimation filter 282 has four delay lines 581, 582, 583, 584 and twelve filter stages. Along each delay line 581 through 584 are eleven memory registers 580 (between each of the twelve filter stages). The memory registers 580 may be implemented using any digital storage element (e.g., flip-flops). In each of the twelve filter stages, the decimation filter 282 of FIG. 5A includes four multipliers 540 that each filter one of the input samples $r(n)$ by the filter coefficient $h_l$ for that multiplier 540. Because the filter coefficients $h_l$ are fixed, the multipliers 540 may be realized using a canonical signed digit (CSD) based implementation. In each of the twelve filter stages, the decimation filter 282 of FIG. 5A also includes an adder 560 that adds the filtered input samples output by each of the four mixers 540 of that filter stage to the partial sum output by the adder 560 of the previous filter stage.

In the example of FIG. 5A, for instance, the most recent input sample $r(47)$ is filtered by the filter coefficient $h_0$, the previous input sample $r(46)$ is filtered by the coefficient $h_1$, etc. Because each adder 560 generates a single partial sum for every four input samples $r(n)$, the decimation filter 282 of FIG. 5A generates one output sample $r(n')$ for every four input samples $r(n)$. Meanwhile, the output sample $r(n')$ represents the 48 most recent input samples $r(0)$ through r(47) filtered by the array of 48 filter coefficients $h_0$ through $h_{47}$. The output sample r(n') of the decimation filter 282 corresponding to the input sample instant n'=4n is shown in equation 12:

$$r(n') = \sum_{l=0}^{L-1} h_l * r(4n - l) \quad (12)$$

As briefly mentioned above, requiring two decimation filters 282 for each band adds to the complexity and cost of the two-stage DDC 200. Meanwhile, as described in detail below, the efficiency of the DDC 200 can be improved by taking advantage of the periodicity of the $k_i f_s/M$ coarse mixing process performed by each coarse mixer 220 and the memory inherent in the convolution operation performed by the decimation filters 282.

Figure 5B:
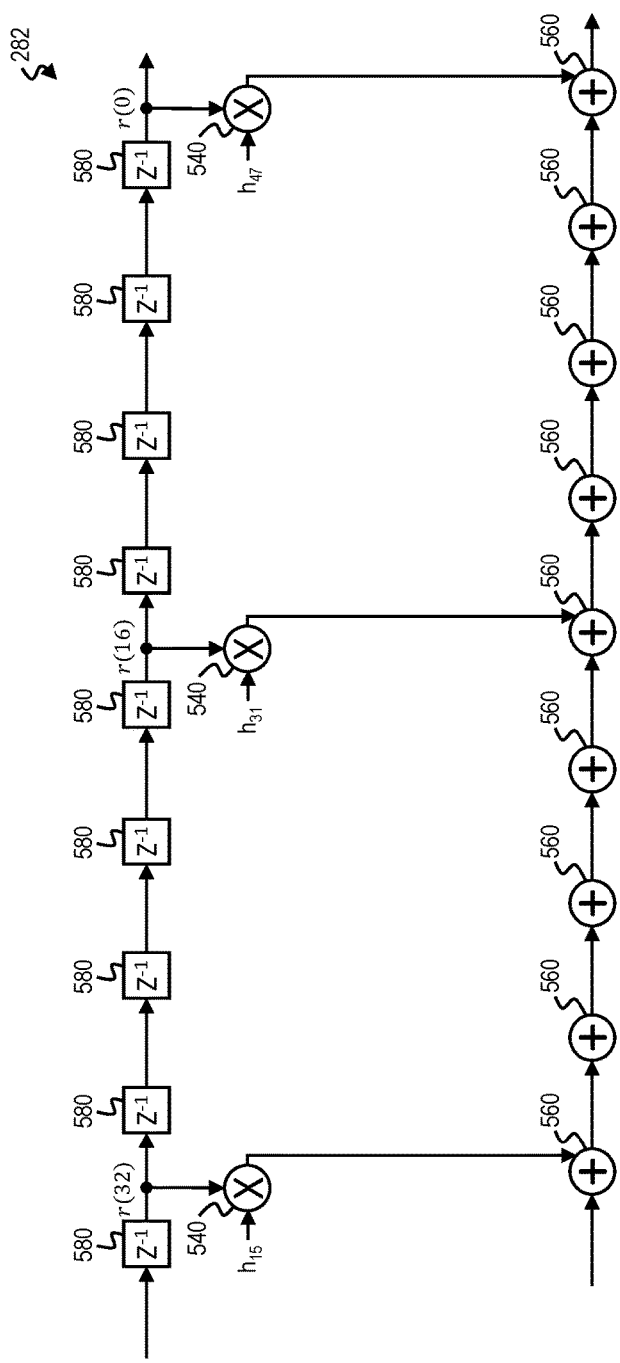
FIG. 5B illustrates three input samples and three filter coefficients of the example decimation filter of FIG. 5A.
Figure 5C:
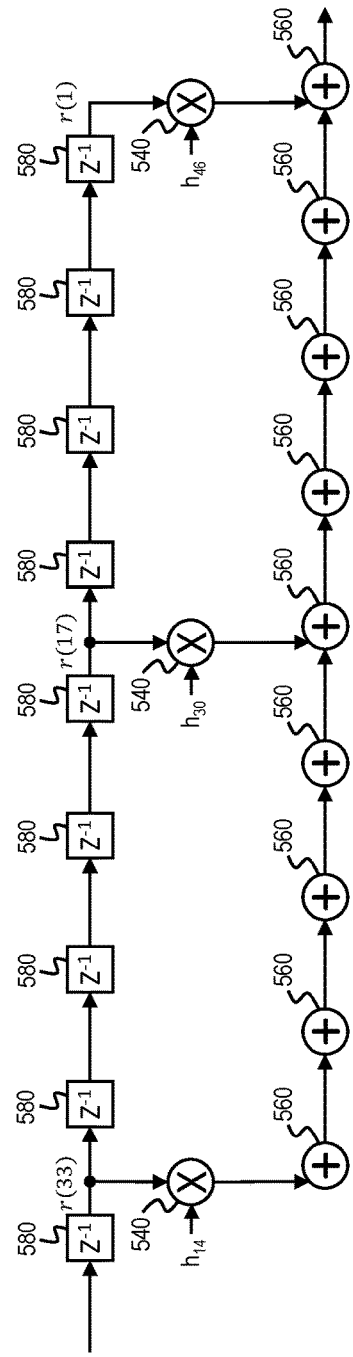
FIG. 5C illustrates three input samples and three filter coefficients of the example decimation filter of FIG. 5A.

The coarse mixer 220 mixes every Mth input sample r(n) by the same complex phasor ϕ. Meanwhile, the decimation filter 282 filters every Lth input sample r(n) by the same fixed filter coefficient $h_l$. As shown in FIG. 3A, for instance, when M=16, the input samples r(0), r(16), and r(32) are all multiplied by 1. Meanwhile, as shown in FIG. 5B, the input samples r(0), r(16), and r(32) are always filtered by the same three fixed filter coefficients $h_l$ (in the example of FIGS. 5A-5B, $h_{47}$, $h_{31}$, and $h_{15}$). Similarly, when M=16 and k=−1 as shown in FIG. 3A, the input samples r(1), r(17), and r(33) are all multiplied by exp(jπ/8). Meanwhile, as shown in FIG. 5C, the input samples r(1), r(17), and r(33) are always filtered by the same three fixed filter coefficients $h_l$ (in the example of FIGS. 5A-5C, $h_{46}$, $h_{30}$, and $h_{14}$). Because of the inherent periodicity of the coarse mixing process, the two-stage digital down-conversion process can be made more efficient by first applying the filtering coefficients $h_l$ before multiplying the appropriate complex phasor ϕ.

Figure 6:
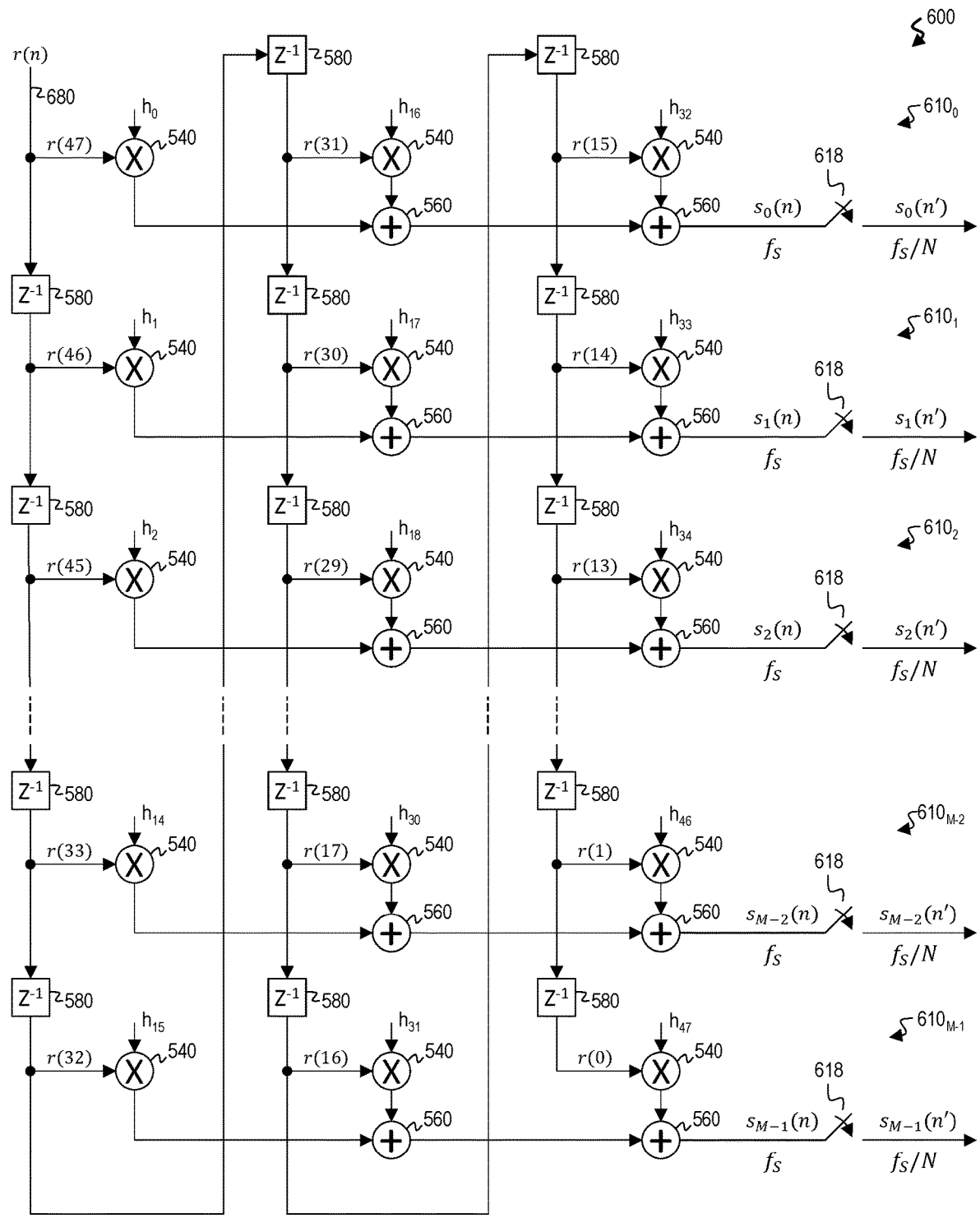
FIG. 6 is a circuit diagram of a modified decimate-by-N filter according to an illustrative embodiment.

FIG. 6 is a schematic diagram of a modified decimate-by-N filter 600 having M subfilters 610 (e.g. $610_0$-$610_{M-1}$) according to an illustrative embodiment. In the embodiment of FIG. 6, the modified decimate-by-N filter 600 has a length L of 48, meaning the input samples r(n) are filtered by 48 filter coefficients $h_l$ (where l is each integer between 0 and L−1 (e.g., 0-47). The modified decimate-by-N filter 600 includes a delay line 680 with 47 (e.g. L−1) memory registers 580. The memory registers 580 may be implemented using any digital storage element (e.g., flip-flops). The memory registers 580 are coupled in series such that each memory register 580 receives an input sample r(n) from the previous memory register 580 (or, for the most recent input sample r(47), from the ADC 110) and outputs that input sample r(n) to the next memory register 580 in series along the delay line 680. Accordingly, the delay line 680 includes the L (e.g. 48) most recent input samples r(47) through r(0). In the embodiment of FIG. 6, the modified decimate-by-N filter 600 also includes L (e.g. 48) multipliers 540 that each filter one of the 48 input samples r(n) by one of the L (e.g. 48) coefficients $h_l$. Because the filter coefficients $h_l$ are fixed, the multipliers 540 may be realized using a canonical signed digit (CSD) based implementation.

In the modified decimate-by-N filter 600, the L multipliers 540 are arranged to form M subfilters $610_0$ through $610_{M-1}$ (individually and collectively referred to as subfilters 610). Each subfilter 610 includes up to ⌈L/M⌉ multipliers 540 (where the ⌈ ⌉ symbol represents a ceiling operation where the operand is rounded up to the nearest integer). In the embodiment of FIG. 6, for instance, each of the 16 subfilters includes three of the 48 multipliers 540. In embodiments where the length L of the modified decimate-by-N filter 700 is not evenly divisible by the number of subfilters M, some of the subfilters 610 may include fewer than L/M multipliers 540.

Each subfilter 610 forms a finite impulse response (FIR) filter having L/M filter stages, including an initial filter stage and one or more subsequent filter stages. In each filter stage of each subfilter 610, a multiplier 540 filters an input sample r(n) by the filter coefficient $h_l$ for that multiplier 540. In the subfilter $610_0$ of FIG. 6, for instance, the input sample r(47) is filtered by the filter coefficient $h_0$ in the initial filter stage and, in the subsequent filter stages, the input sample r(31) is filtered by the filter coefficient $h_{16}$ and the input sample r(15) is filtered by the filter coefficient $h_{32}$. In each of the subsequent filter stages after the initial filter stage, each subfilter 610 includes an adder 560 that adds the filtered input sample output by the multiplier 540 in that filter stage to the partial sum output by the adder 560 of the previous filter stage (or, if the previous filter stage is the initial filter stage, the filtered input sample output by the multiplier 540 of the initial filter stage).

In the embodiment of FIG. 6, each of the M subfilters 610 generates a subfilter output $s_m(n)$ by filtering ⌈L/M⌉ of the L most-recent input samples r(n) output by the ADC 110 using the same filter coefficients $h_l$ as the decimation filter 282 of FIGS. 5A-5C. However, unlike the decimated output samples r(n') of the decimation filter 282 of FIG. 5A-5C, the subfilter outputs $s_m(n)$ are generated by the subfilters 610 of FIG. 6 at the sampling rate $f_s$ of the ADC 110. Accordingly, in some embodiments, each subfilter 610 of the modified decimate-by-N filter 600 may also decimate the subfilter output $s_m(n)$ by a factor of N. In the embodiment of FIG. 6, for instance, each subfilter 610 includes a switch 618 that outputs one decimated subfilter output $s_m(n')$ for every N subfilter outputs $s_m(n)$ generated by that subfilter 610. Alternatively, in other embodiments, each subfilter 610 of the decimate-by-N filter 600 may generate subfilter outputs $s_m(n')$ at the reduced sampling rate of $f_s/N$.

Figure 7A:
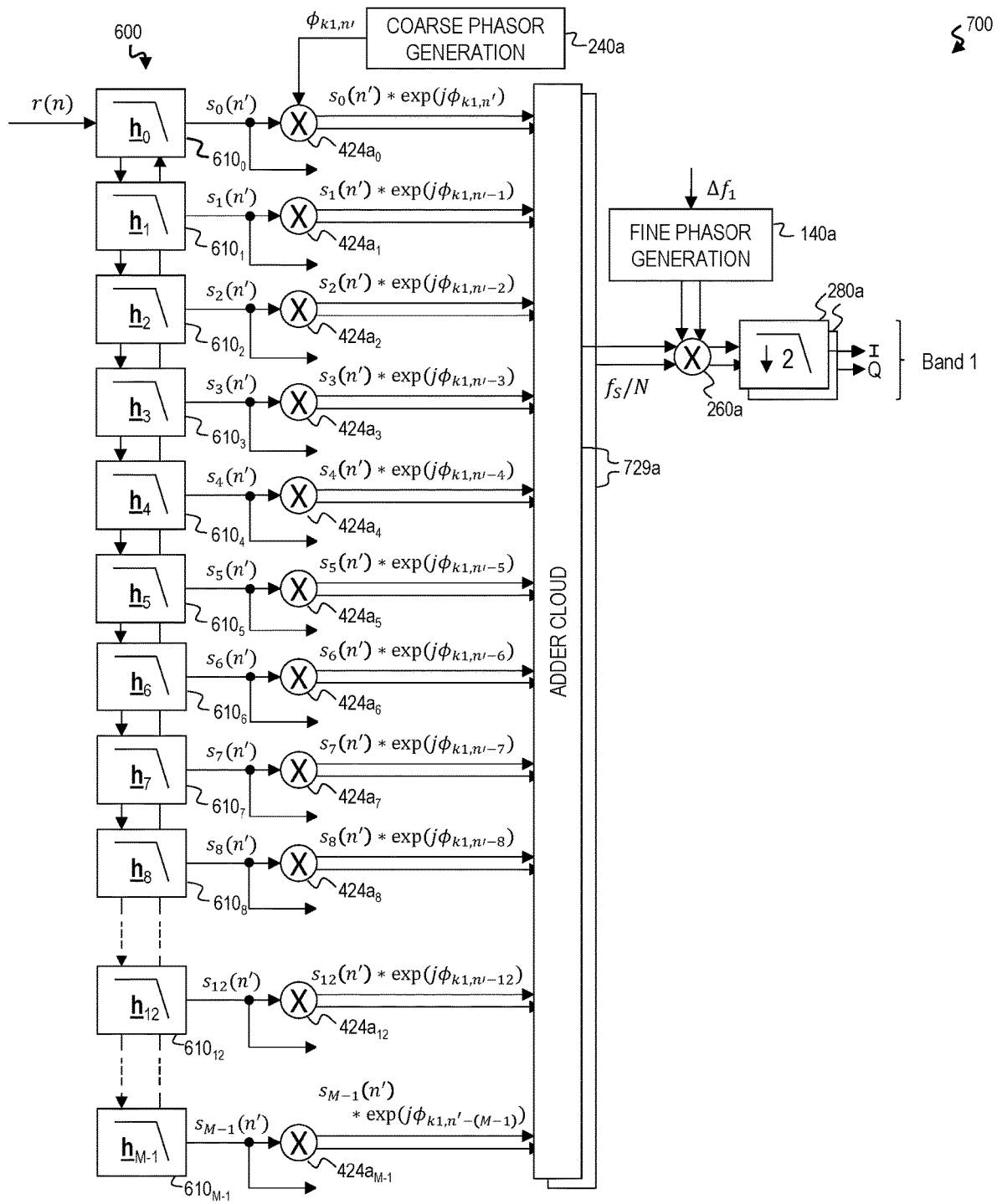
FIGS. 7A and 7B are circuit diagrams of a DDC utilizing the modified decimate-by-N filter of FIG. 6 according to an illustrative embodiment.
Figure 7B:
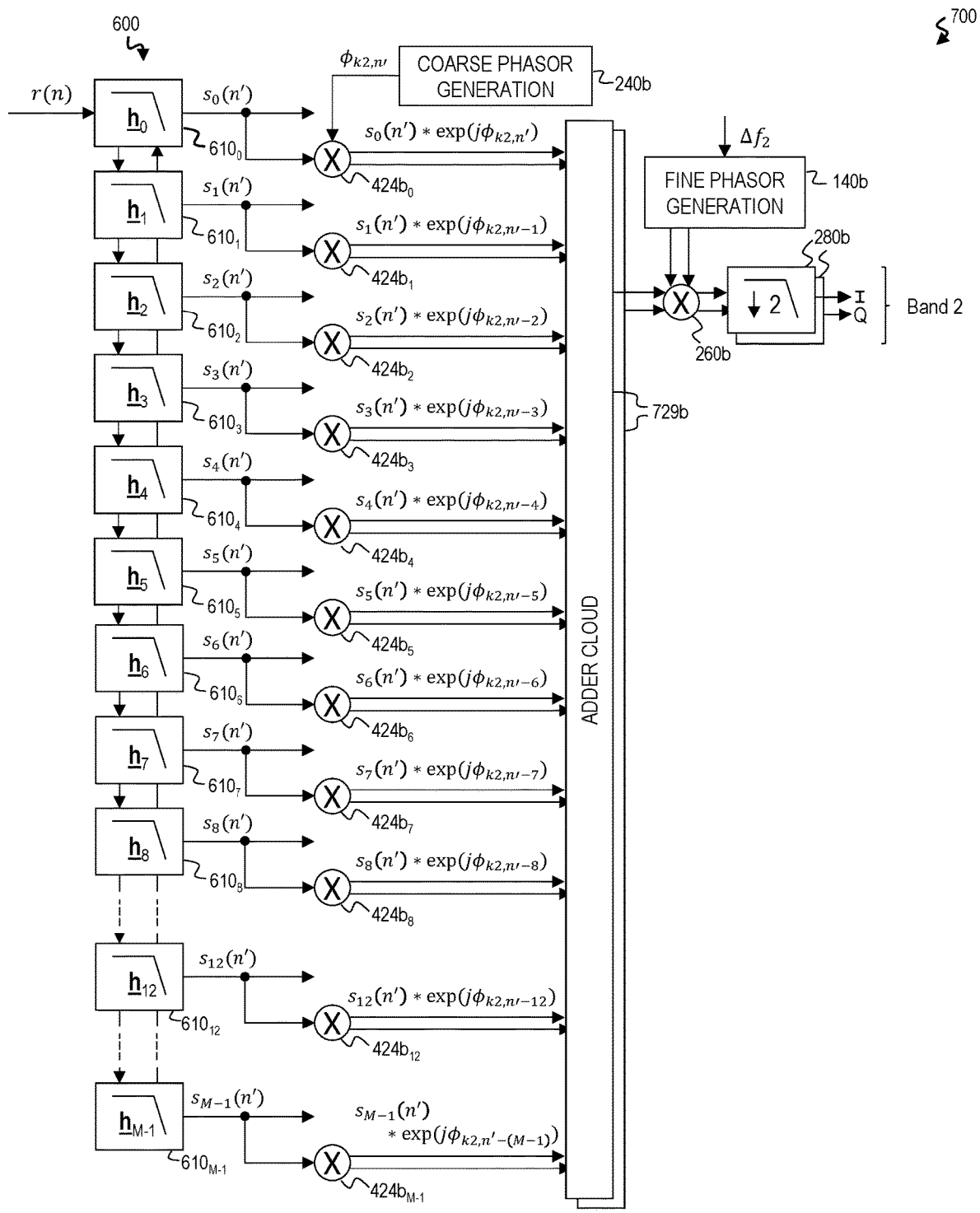

FIGS. 7A and 7B are block diagrams of a DDC 700 utilizing the modified decimate-by-N filter 600 according to an illustrative embodiment. In the embodiment of FIGS. 7A and 7B, the DDC 700 down-converts the input samples r(n) received from the ADC 110 by the center frequency $f_1$ of the first frequency band as shown in FIG. 7A and down-converts the input samples r(n) received from the ADC 110 by the center frequency $f_2$ of the second frequency band as shown in FIG. 7B. While two bands are illustrated in this embodiment, DDC 700 may be scaled to accommodate more (or fewer) bands in other embodiments.

As described above with reference to FIG. 6, the modified decimate-by-N filter 600 generates M subfilter outputs $s_m(n')$. As shown in FIG. 7A, each of the M subfilter outputs $s_m(n')$ are output to one of M mixers $424a_0$ through $424a_{M-1}$ (individually and collective referred to as mixers 424a) for the first band. The M mixers 424a for the first band down-convert the signal received from the ADC 110 by the coarse frequency $f_{C1}$. As described above with reference to FIG. 2, the frequency partition circuitry 250a (not shown) for the first band selects the coarse frequency $f_{C1}$ by selecting the integer $k_1$ wherein the coarse frequency $f_{C1}=k_1 f_s/M$ is closest to the center frequency $f_1$ of the first frequency band. Each of the M mixers 424a for the first band mixes one of the M subfilter outputs $s_m(n')$ with the phasor of $\phi_{k1,n'-m}$ (output by the coarse phasor generation circuitry 240a) for the frequency index $k_1$ selected for the first band and corresponding to the sample index n' of the subfilter output $s_m(n')$. Each mixer 424a generates both an I-phase signal (by mixing the subfilter output $s_m(n)$ with the cosine of $\phi_{k1,n'-m}$) and a Q-phase signal (by mixing the subfilter output $s_m(n')$ with the sine of $\phi_{k1,n'-m}$). In the embodiment of FIG. 7A, each mixer 424a is coupled to two adder clouds 729a (one for each of the I- and Q-phase signals). Each adder cloud 729a combines and outputs the down-sampled (I-phase or Q-phase) signal to the fine mixer 260a, which shifts the down-converted signal by a residual amount $\Delta f_1$ (that is equal to the difference between $f_1$ and $f_{c1}$) by mixing the down-converted signal with phasors generated by the fine phasor generation circuitry 140a. In the embodiment of FIG. 7A, the signal centered around DC output by the fine mixer 140a is further decimated by additional decimation filters 280a.

As shown in FIG. 7B, each of the M subfilter outputs $s_m(n')$ are also output to one of M mixers $424b_0$ through $424b_{M-1}$ (individually and collective referred to as mixers 424b) for the second band. The M mixers 424b for the second band down-convert the signal received from the ADC 110 by the coarse frequency $f_{C2}$, which is selected by the frequency partition circuitry 250b (not shown) by selecting the frequency index $k_2$ wherein the coarse frequency $f_{C2}=k_2f_s/M$ is closest to the center frequency $f_2$ of the second frequency band. Each of the M mixers 424b for the second band mixes one of the M subfilter outputs $s_m(n')$ with the phasor $\phi_{k2,n'-m}$ (output by the coarse phasor generation circuitry 240b) for the frequency index $k_2$ selected for the second band and corresponding to the sample index n' of the subfilter output $s_m(n')$. Each mixer 424b generates both an I-phase signal (by mixing the subfilter output $s_m(n)$ with the cosine of $\phi_{k2,n'-m}$) and a Q-phase signal (by mixing the subfilter output $s_m(n')$ with the sine of $\phi_{k2,n'-m}$). In the embodiment of FIG. 7B, each mixer 424b is coupled to two adder clouds 729b (one for each of the I- and Q-phase signals). Each adder cloud 729b combines and outputs the down-sampled (I-phase or Q-phase) signal to the fine mixer 260b, which shifts the down-converted signal by the residual amount $\Delta f_2$ (that is equal to the difference between $f_2$ and $f_{C2}$) by mixing the down-converted signal with phasors generated by the fine phasor generation circuitry 140b. In the embodiment of FIG. 7B, the signal centered around DC output by the fine mixer 140b is further decimated by additional decimation filters 280b.

As described above with reference to FIG. 2, each coarse mixer 220 of the prior art DDC 200 rotates the input samples r(n) by a complex phasor $\exp(-j2\pi k_i n/16)$ and each decimation filter 282 of the prior art DDC 200 filters and decimates the I- or Q-phase signal for one of the frequency bands. By contrast, the DDC 700 takes advantage of the inherent periodicity of the $k_i f_s/M$ coarse mixing process by applying the appropriate filtering coefficients (as shown in FIG. 6, for instance, $h_{47}$ for r(0), $h_{31}$ for r(16), and $h_{15}$ for r(32)) before multiplying the appropriate complex phasor $\phi$. Accordingly, the DDC 700 eliminates the need for a separate decimation filter 282 for each of the I- and Q-phase signals in each of the frequency bands.

In the embodiment of FIGS. 7A and 7B, the DDC 700 multiplies one of the subfilter outputs $s_m(n')$ by each of the M phasors $\phi_{k1,n'-m}$ for the first frequency band and each of the M phasors $\phi_{k2,n'-m}$ for the second frequency band. In some embodiments, instead of performing M multiplication operations for each frequency band, the efficiency of the DDC 700 is improved by taking advantage of the symmetry around the origin of the unit circle. Referring back to FIG. 3A, when the frequency index $k_i$ is odd, $\phi_m$ is always equal to $-\phi_{M/2+m}$. For instance, when M=16 and $k_i=-1$ as shown in FIG. 3A, $\phi_0=1$ and $\phi_8=-1$. Similarly, $\phi_4=j$ and $\phi_{12}=-j$, etc. Because $\phi_m=-\phi_{M/2+m}$, instead of multiplying the subfilter output $s_m(n')$ by the phasor $\phi_m$, multiplying the subfilter output $s_{M/2+m}(n')$ by the phasor $\phi_{M/2+m}$, and adding the two products together, the subfilter output $s_{M/2+m}(n')$ can be subtracted from the subfilter output $s_m(n')$ (when $k_i$ is odd) and the difference can be multiplied by the phasor $\phi_m$. In the example of FIG. 3A, for instance, $s_0(n')-s_8(n')$ can be multiplied by 1, $s_1(n')-s_9(n')$ can be multiplied by $e^{j\pi/8}$, $s_2(n')-s_{10}(n')$ can be multiplied by $e^{j\pi/4}$, etc.

As shown in FIG. 2, when the frequency index $k_i$ is even, $\phi_m$ is always equal to $\phi_{M/2+m}$. When M=16, for instance, $\phi_0=\phi_8$, $\phi_1=\phi_9$, etc. Therefore, when the frequency index $k_i$ is even, each subfilter output $s_{M/2+m}(n')$ can be added to the subfilter output $s_m(n')$ and the sum can be multiplied by the phasor $\phi_m$. In the example of FIG. 3B, for instance, $s_0(n')+s_8(n')$ can be multiplied by 1, $s_1(n')+s_9(n')$ can be multiplied by $e^{j\pi/4}$, $s_2(n')+s_{10}(n')$ can be multiplied by j, etc.

Figure 8A:
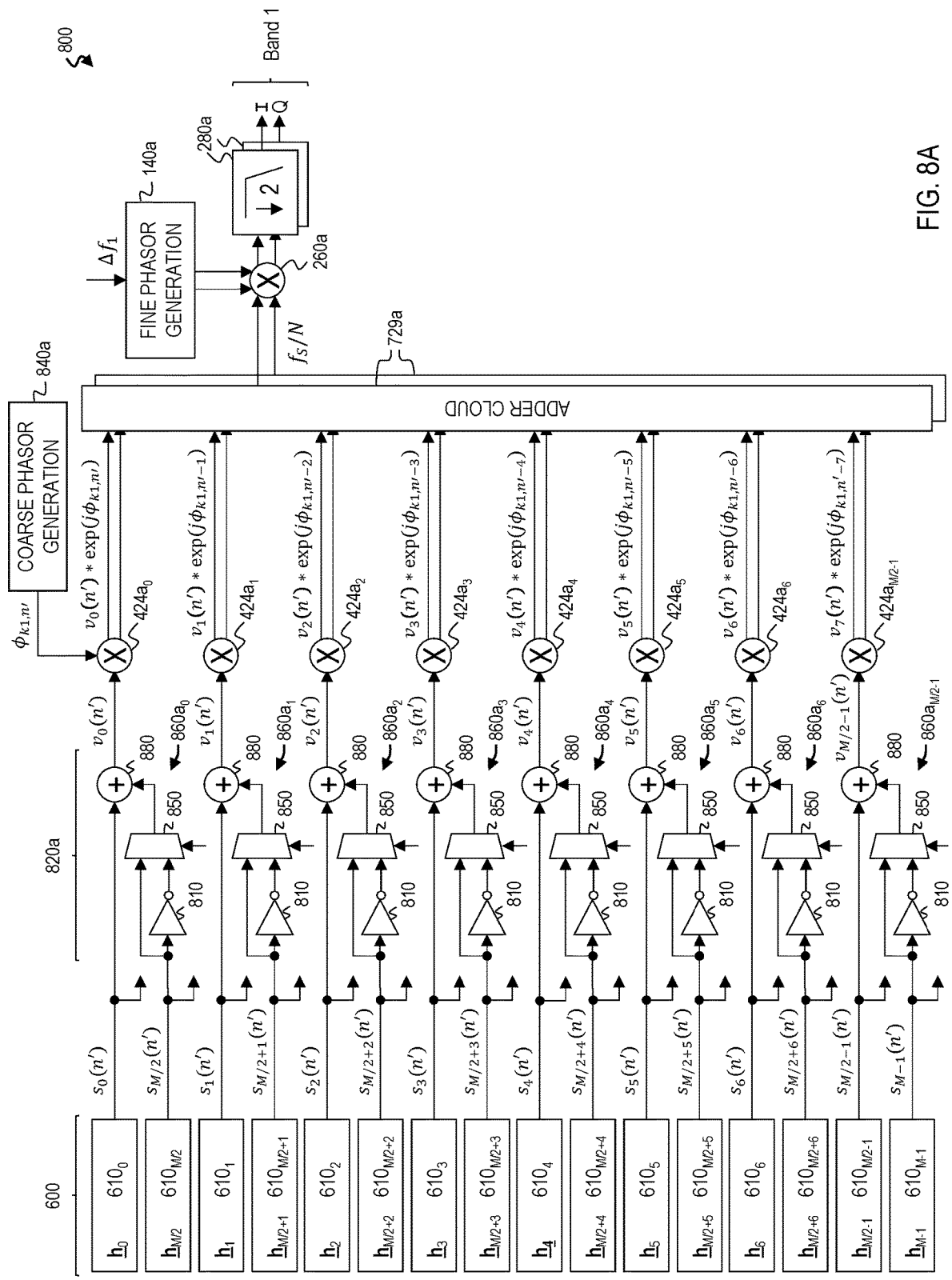
FIGS. 8A and 8B are circuit diagrams of a DDC according to an illustrative embodiment.
Figure 8B:
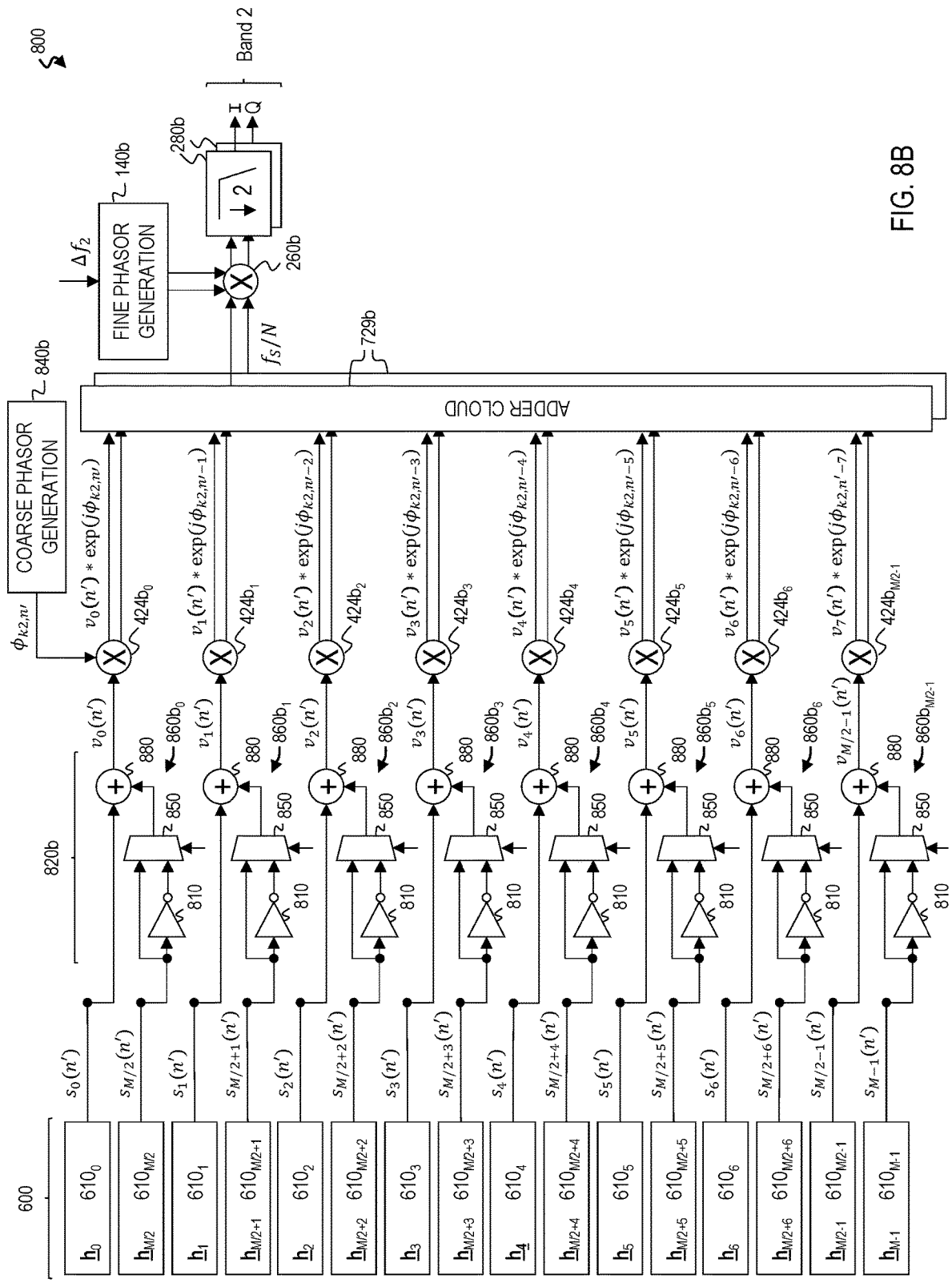

FIGS. 8A and 8B are block diagrams of a DDC 800 according to an illustrative embodiment. In the embodiment of FIGS. 8A and 8B, the DDC 800 down-converts the input samples r(n) received from the ADC 110 by the center frequency $f_1$ of the first frequency band as shown in FIG. 8A and down-converts the input samples r(n) received from the ADC 110 by the center frequency $f_2$ of the second frequency band as shown in FIG. 8B. While two bands are illustrated in this embodiment, DDC 800 may be scaled to accommodate more (or fewer) bands in other embodiments.

In the embodiment of FIGS. 8A and 8B, the DDC 800 includes the modified decimate-by-N filter 600 described above with reference to FIG. 6, which filters and decimates the input samples r(n) received from the ADC 110 to generate M subfilter outputs $s_m(n')$. As shown in FIG. 8A, the DDC 800 also includes a single-stage pre-combiner 820a for the first band, which combines the M subfilter outputs $s_m(n')$ into M/2 combined subfilter outputs $v_m(n')$ by adding or subtracting the subfilter outputs $s_m(n')$ and $s_{M/2+m}(n')$ depending on whether the frequency index $k_1$ selected for the first band is even or odd. Each of the M/2 combined subfilter outputs $v_m(n')$ are output to one of M/2 mixers $424a_0$ through $424a_{M/2-1}$ for the first band, which each mix the combined subfilter output $v_m(n')$ with a complex phasor $\phi_{k1,n'-m}$ (output by a coarse phasor generation circuit 840a for the first band) for the frequency index $k_1$ of the first band and corresponding to the index n' of the combined subfilter output $v_m(n')$. Each mixer 424a generates both an I-phase signal (by mixing the combined subfilter output $v_m(n)$ with the cosine of $\phi_{k1,n'}$) and a Q-phase signal (by mixing the combined subfilter output $v_m(n')$ with the sine of $\phi_{k1,n'-m}$). In the embodiment of FIG. 8A, each mixer 424a is coupled to two adder clouds 729a (one for each of the I- and Q-phase signals). Each adder cloud 729a combines and outputs the down-sampled (I-phase or Q-phase) signal to the fine mixer 260a, which shifts the down-converted signal by a residual amount $\Delta f_1$ (that is equal to the difference between $f_1$ and $f_{C1}$) by mixing the down-converted signal with phasors generated by the fine phasor generation circuitry 140a. In the embodiment of FIG. 8A, the signal centered around DC output by the fine mixer 140a is further decimated by additional decimation filters 280a. Similar to the coarse phasor generation circuitry 240a of FIG. 2, the coarse phasor generation circuitry 840a generates the phasors $\phi_{k1,n'}$ for the first band by updating the phase $\phi_{1,n}$ for the first band as shown in equation 7 above and calculating the cosine and sine of $\phi_{1,n}$.

In the embodiment of FIG. 8A, the single-stage pre-combiner 820a includes M/2 adders 880, which each have a first input coupled to the output of one of the subfilters $610_0$ through $610_{M/2-1}$ and a second input coupled to the output of one of M/2 multiplexers 850. Each of the multiplexers 850 has a first input coupled to the output of one of the subfilters $610_{M/2}$ through $610_{M-1}$ and a second input coupled to the output of the same subfilter $610_{M/2}$-$610_{M-1}$ via an inverter 810. Each of the M/2 adders 880 are coupled to a subfilter $610_m$ and the subfilter $610_{M/2+m}$ via one the multiplexers 850 and one of the inverters 810. Together, each adder 880, multiplexer 850, and inverter 810 forms an adder-subtractor 860a.

In the embodiment of FIG. 8A, the single-stage pre-combiner 820a includes M/2 adder-subtractors $860a_0$ through $860a_{M/2-1}$ that generate M/2 combined subfilter outputs $v_0(n')$ through $v_{M/2-1}(n')$ by either adding $s_m(n')$ and $s_{M/2+m}(n')$ or subtracting $s_{M/2+m}(n')$ from $s_m(n')$. To do so, all of the M/2 multiplexers 850 of the single-stage pre-combiner 820a for the first band are configured to select and output either the output of the subfilter $610_{M/2+m}$ or the output of the inverter 810 in response to a single control signal for the first band output by the coarse phasor generation circuitry 840a. The coarse phasor generation circuitry 840a outputs a control signal causing all of the multiplexers 850 to select the output of the subfilter $610_{M/2+m}$ if $k_1$ is even and a control signal causing all of the multiplexers 850 to select the output of the inverter 810 if $k_1$ is odd. In the specific example of FIG. 8A, coarse phasor generation circuitry 840a outputs a control signal of 0 if $k_1$ is even and a control signal of 1 if $k_1$ is odd. Accordingly, the single-stage pre-combiner 820a generates the M/2 combined subfilter outputs $v_m(n')$ by adding the subfilter outputs $s_m(n')$ and $s_{M/2+m}(n')$ if $k_1$ is even or by subtracting the subfilter outputs $s_{M/2+m}(n')$ from the subfilter outputs $s_m(n')$ if $k_1$ is odd.

As shown in FIG. 8B, the DDC 800 also includes a single-stage pre-combiner 820b for the second band, which includes M/2 adder-subtractors $860b_0$ through $860b_{M/2-1}$ (individually and collective referred to as adder-subtractors 860b) that combine the M subfilter outputs $s_m(n')$ into M/2 combined subfilter outputs $v_m(n')$ by adding or subtracting the subfilter outputs $s_m(n')$ and $S_{M/2+m}(n')$ depending on whether the frequency index $k_2$ selected for the second band is even or odd. Each of the M/2 adder-subtractors 860b includes an adder 880 with a first input coupled to the output of one of the subfilters $610_0$ through $610_{M/2-1}$ and a second input coupled to the output of a multiplexer 850 having a first input coupled to the output of one of the subfilters $610_{M/2}$ through $610_{M-1}$ and a second input coupled to the output of the same subfilter $610_{M/2}$-$610_{M-1}$ via an inverter 810.

Each of the M/2 combined subfilter outputs $v_m(n')$ are output to one of M/2 mixers $424b_0$ through $424b_{M/2-1}$ for the second band, which each mix the combined subfilter output $v_m(n')$ with a complex phasor $\phi_{k2,n'-m}$ (output by a coarse phasor generation circuit 840b for the second band) for the frequency index $k_2$ of the second band and corresponding to the index n' of the combined subfilter output $v_m(n')$. Each mixer 424b generates both an I-phase signal (by mixing the combined subfilter output $v_m(n)$ with the cosine of $\phi_{k2,n'-m}$) and a Q-phase signal (by mixing the combined subfilter output $v_m(n')$ with the sine of $\phi_{k2,n'-m}$). In the embodiment of FIG. 8B, each mixer 424b is coupled to two adder clouds 729b (one for each of the I- and Q-phase signals). Each adder cloud 729b combines and outputs the down-sampled (I-phase or Q-phase) signal to the fine mixer 260b, which shifts the down-converted signal by a residual amount $\Delta f_2$ (that is equal to the difference between $f_2$ and $f_{C2}$) by mixing the down-converted signal with phasors generated by the fine phasor generation circuitry 140b. In the embodiment of FIG. 8B, the signal centered around DC output by the fine mixer 140b is further decimated by additional decimation filters 280b. The coarse phasor generation circuitry 840b generates the phasors $\phi_{k2,n}$ for the second band by updating the phase $\phi_{2,n}$ for the second band as shown in equation 8 above and calculating the cosine and sine of $\phi_{2,n}$.

In the embodiment of FIG. 8B, the single-stage pre-combiner 820b includes M/2 adders 880, which each have a first input coupled to the output of one of the subfilters $610_0$ through $610_{M/2-1}$ and a second input coupled to the output of one of M/2 multiplexers 850. Each of the multiplexers 850 has a first input coupled to the output of one of the subfilters $610_{M/2}$ through $610_{M-1}$ and a second input coupled to the output of the same subfilter $610_{M/2}$-$610_{M-1}$ via an inverter 810. Each adder 880 is coupled to a subfilter $610_m$ and the subfilter $610_{M/2+m}$ via one the multiplexers 850 and one of the inverters 810. All of the multiplexers 850 of the single-stage pre-combiner 820b for the second band select and output either the output of the subfilter $610_{M/2+m}$ or the output of the inverter 810 in response to a single control signal for the second band output by the coarse phasor generation circuitry 840b. The coarse phasor generation circuitry 840b outputs a control signal causing all of the multiplexers 850 to select the output of the subfilter $610_{M/2+m}$ if $k_2$ is even and a control signal causing all of the multiplexers 850 to select the output of the inverter 810 if $k_2$ is odd. In the specific example of FIG. 8B, coarse phasor generation circuitry 840b outputs a control signal of 0 if $k_2$ is even and a control signal of 1 if $k_2$ is odd. Accordingly, the single-stage pre-combiner 820b generates the M/2 combined subfilter outputs $v_m(n')$ by adding the subfilter outputs $s_m(n')$ and $s_{M/2+m}(n')$ if $k_2$ is even or by subtracting the subfilter outputs $s_{M/2+m}(n')$ from the subfilter outputs $s_m(n')$ if $k_2$ is odd.

By reducing the number of multiplication operations to down-convert the signal received from the ADC 110 by the coarse frequencies $f_{C1}$ and $f_{C2}$, the single-stage pre-combiners 820a and 820b improve the efficiency of the DDC 800 relative to the DDC 700. In some embodiments, the efficiency of the DDC 800 is further improved by taking advantage of the symmetry across the unit circle.

As shown in equation 11 above, the complex output $x_i(n)$ of each coarse mixer 220 is.

$$x_i(n) = r(n) * \exp\left(\frac{-j2\pi k_i n}{M}\right) \quad (11)$$

where r(n) is the input received from the ADC 110, $k_i$ is the frequency index of the frequency band, and $$\exp\left(\frac{-j2\pi k_i n}{M}\right)$$

is the complex phasor.

Meanwhile, as shown in equation 12 above, the decimated sample r(n') corresponding to the input sample instant n'=4n is:

$$r(n') = \sum_{l=0}^{L-1} h_l * r(4n - l) \quad (12)$$

Mathematically, the sub-filter outputs $s_m(4n)$ generated by the modified decimate-by-N filter 600 are defined as shown in equation 13:

$$s_m(4n) = \sum_{l=0}^{\lceil L/M \rceil - 1} h(m+16l) * r(4n - m - M*l), \quad (13)$$

$$\forall\, m = 0, 1, \ldots, M-1$$

Accordingly, the output $y(n')$ of the filtered coarse mixer 220 can be written as a function of the sub-filter outputs $s_m(4n)$ as shown in equation 14 or equation 15:

$$y(n') = \sum_{m=0}^{M-1} s_m(4n) * \exp\left\{\frac{-j2\pi k_i(4n-m)}{M}\right\} \quad (14)$$

$$y(n') = \sum_{m=0}^{M-1} s_m(4n) * \exp\left\{\frac{j2\pi k_i m}{M}\right\} * \exp\left\{\frac{-j2\pi k_i * 4n}{M}\right\} \quad (15)$$

Note that one of the complex phasor sub-terms, $$\exp\left\{\frac{j2\pi k_i m}{M}\right\},$$

is static for a given coarse mixer frequency index $k_i$. The other term, exp $$\exp\left\{\frac{-j2\pi k_i * 4n}{M}\right\},$$

becomes $$\exp\left\{\frac{-j2\pi k_i n}{4}\right\}$$

for a value of M=16 and takes one of at most 4 values, $\{1, j, -1, -j\}$, as function of the sample index n, and can be performed as a "post-rotation" operation (as described below with reference to FIG. 10).

Figure 8C:
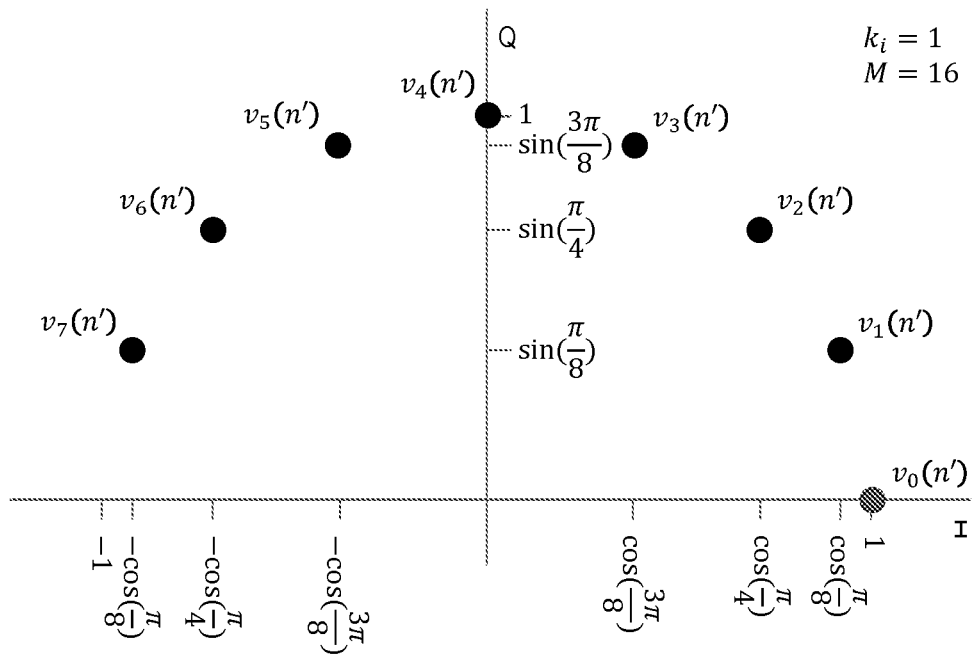
FIGS. 8C and 8D are graphs depicting complex phasor sub-terms when the frequency index is 1.
Figure 8D:
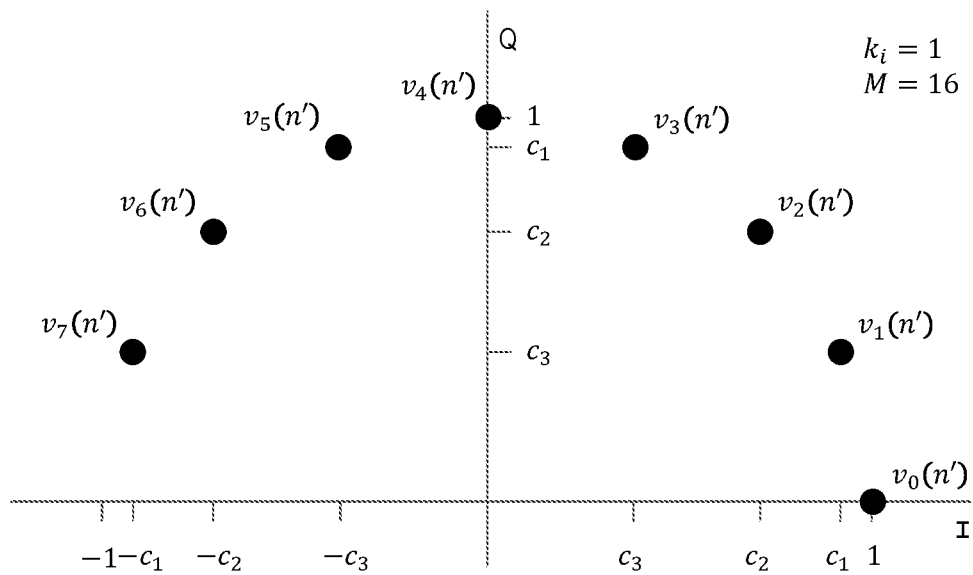

FIG. 8C is a graph of the complex phasor sub-terms $$\exp\left\{\frac{j2\pi k_i m}{M}\right\}$$

when $k_i=1$ and M=16. In the graph of FIG. 8C, the complex phasor sub-term $$\exp\left\{\frac{j2\pi k_i m}{M}\right\}$$

for each subfilter output $v_m(n')$ is shown on the I-Q coordinate plane, where the horizontal axis represents I-phase (cosine) component and the vertical axis represents the Q-phase (sine) component. FIG. 8D is the graph of FIG. 8C where $c_1=\cos(\pi/8)$, $c_2=\cos(\pi/4)$, and $c_3=\cos(3\pi/8)$.

Looking at the Q-phase components in FIG. 8D, when $k_i=1$, both $v_1(n')$ and $v_7(n')$ are multiplied by $c_3$, both $v_2(n')$ and $v_6(n')$ are multiplied by $c_2$, both $v_3(n')$ and $v_5(n')$ are multiplied by $c_1$, and $v_4(n')$ is multiplied by 1. Meanwhile, the Q-phase component of $v_0(n')$ is always 0 (for any value of $k_i$) because m=0 and sin(0)=0. Accordingly, when $k_i=1$, the M/2 subfilter outputs $v_0$ through $v_{M/2-1}$ into P=M/4 partial sums for the Q-phase signal as shown in equations 16-19:

$$u_{Q,0}(n') = v_4(n') \quad (16)$$

$$u_{Q,1}(n') = v_1(n') + v_7(n') \quad (17)$$

$$u_{Q,2}(n') = v_2(n') + v_6(n') \quad (18)$$

$$u_{Q,P-1}(n') = v_3(n') + v_5(n') \quad (19)$$

Looking at the I-phase components in FIG. 8D, when $k_i=1$, $v_1(n')-v_7(n')$ can be multiplied by $c_1$, $v_2(n')-v_6(n')$ can be multiplied by $c_2$, $v_3(n')-v_5(n')$ can be multiplied by $c_3$, $v_4(n')$ is multiplied by 0, and $v_0(n')$ is always multiplied by 1 (for any value of $k_i$) because m=0 and cos(0)=1. Accordingly, when k=1, the M/2 subfilter outputs $v_0$ through $v_{M/2-1}$ can be combined into P partial sums for the I-phase signal as shown in equations 20-23:

$$u_{I,0}(n') = v_0(n') \quad (20)$$

$$u_{I,1}(n') = v_1(n') - v_7(n') \quad (21)$$

$$u_{I,2}(n') = v_2(n') - v_6(n') \quad (22)$$

$$u_{I,P-1}(n') = v_3(n') - v_5(n') \quad (23)$$

When M=16, the same process used to generate the partial sums u for $k_i=1$ can be used whenever $k_i$ mod 4=1 (i.e., when $k_i$ is 1, 5, 9, 13, etc.).

Figure 8E:
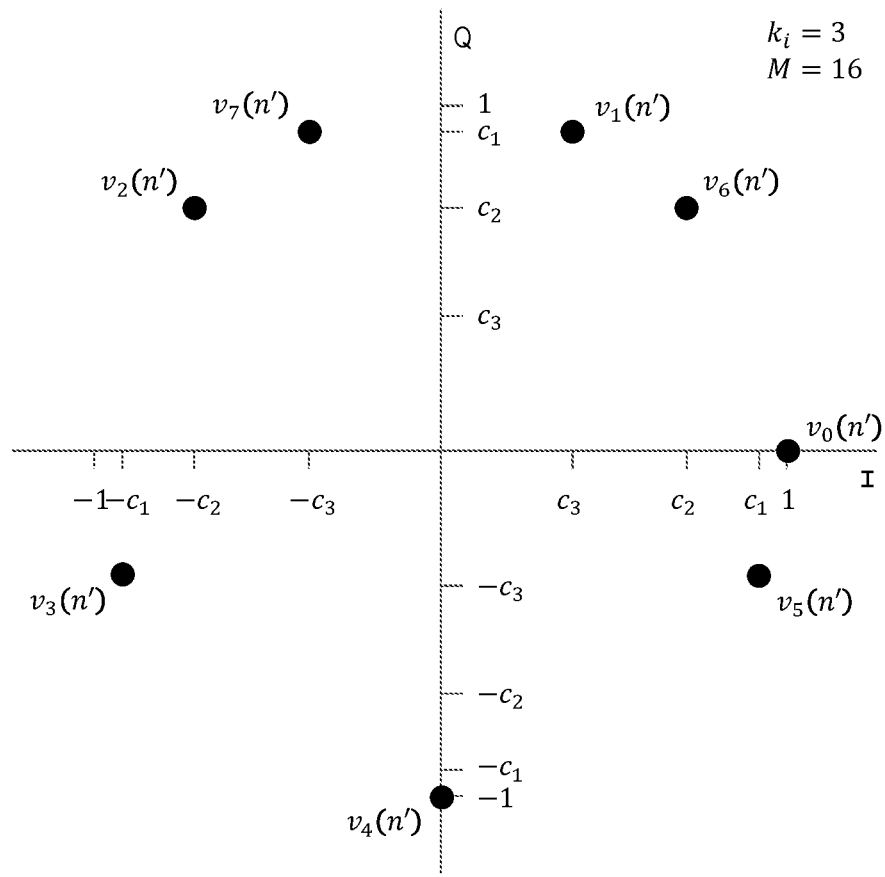
FIG. 8E is a graph depicting complex phasor sub-terms when the frequency index is 3.

FIG. 8E is a graph of the complex phasor sub-terms $$\exp\left\{\frac{j2\pi k_i m}{M}\right\}$$

$k_i=3$ and M=16. Looking at the I-phase components in FIG. 8E, $k_i=3$, $v_1(n')-v_7(n')$ can be multiplied by $c_3$, $v_2(n')-v_6(n')$ can be multiplied by $-c_2$, $v_3(n')-v_5(n')$ can be multiplied by $-c_1$, $v_4(n')$ is multiplied by 0, and $v_0(n')$ is always multiplied by 1. Those subfilter outputs $v_m(n')$ can be combined in a similar fashion whenever $k_i$ mod 4=3 (i.e., when $k_i$ is 3, 7, 11, 15, etc.). Accordingly, whenever $k_i$ is odd, the M/2 subfilter outputs $v_0$ through $v_{M/2-1}$ can be combined into P partial sums for the I-phase signal as shown in equations 20-23 above.

Looking at the Q-phase components in FIG. 8E, when $k_i=3$, both $v_1(n')$ and $v_7(n')$ are multiplied by $c_1$, both $v_2(n')$ and $v_6(n')$ are multiplied by $c_2$, and both $v_3(n')$ and $v_5(n')$ are multiplied by $-c_3$. Accordingly, $v_1(n')+v_7(n')$ can be multiplied by $c_1$, $v_2(n')+v_6(n')$ can be multiplied by $c_2$, and $v_3(n')+v_5(n')$ can be multiplied by $-c_3$. Accordingly, whenever $k_i$ is odd, the three partial sums $u_{Q,1}$ through $u_{Q,P-1}$ may be generated using equations 17-19 above. However, unlike when $k_i$ mod 4=1 (i.e., when $k_i$ is 1, 5, etc.), $v_4(n')$ is multiplied by $-1$ whenever $k_i$ mod 4=3 (i.e., when $k_i$ is 3, 7, etc.). Therefore, when $k_i$ mod 4=3, $u_{Q,0}=-v_4(n')$.

Figure 8F:
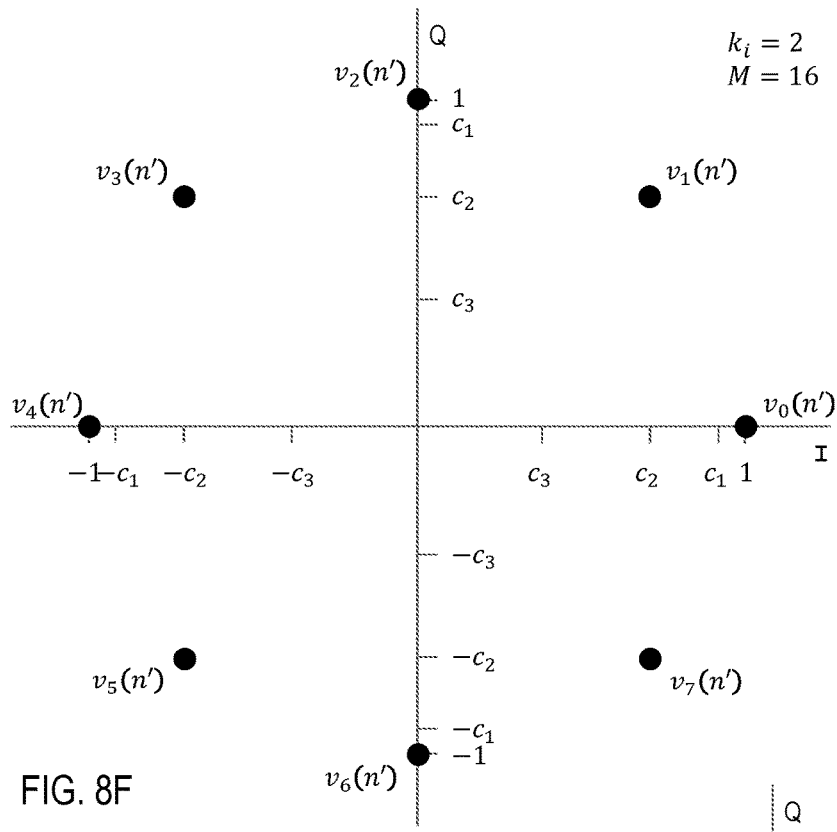
FIG. 8F is a graph depicting complex phasor sub-terms when the frequency index is 2.
Figure 8G:
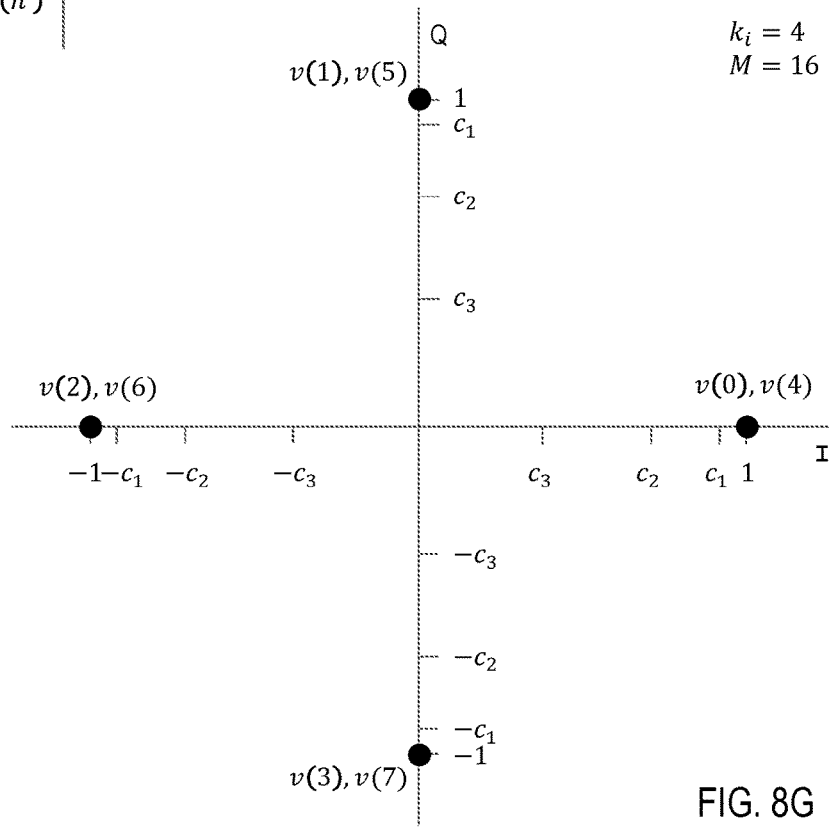
FIG. 8G is a graph depicting complex phasor sub-terms when the frequency index is 4.

FIG. 8F is a graph of the complex phasor sub-terms $$\exp\left\{\frac{j2\pi k_i m}{M}\right\}$$

when $k_i=2$ and M=16. FIG. 8G is a graph of the complex phasor sub-terms $$\exp\left\{\frac{j2\pi k_i m}{M}\right\}$$

when $k_i=4$ and M=16. As shown in FIGS. 8F and 8G, when $k_i$ is even, the M/2 subfilter outputs $v_0$ through $v_{M/2-1}$ can be combined into P partial sums for the Q-phase signal as shown in equations 24-27:

$$u_{Q,0}=0 \tag{24}$$

$$u_{Q,1}=v_1(n')-v_7(n') \tag{25}$$

$$u_{Q,2}=v_2(n')-v_6(n') \tag{26}$$

$$u_{Q,P-1}=v_3(n')-v_5(n') \tag{27}$$

Looking at the I-phase components in FIGS. 8F and 8G, when $k_i$ is even, the three partial sums $u_{Q,1}$ through $u_{Q,P-1}$ may be generated using equations 28-30:

$$u_{I,1}=v_1(n')+v_7(n') \tag{28}$$

$$u_{I,2}=v_2(n')+v_6(n') \tag{29}$$

$$u_{I,3}=v_3(n')+v_5(n') \tag{30}$$

When $k_i$ is divisible by 4, the partial sum $u_{I,0}$ may be generated using equation 31:

$$u_{1,0}=v_0(n')+v_4(n') \tag{31}$$

When $k_i$ is not divisible by 4 but is otherwise even (e.g., $k_i=2$), the partial sum $u_{I,0}$ may be generated using equation 32:

$$u_{1,0}=v_0(n')-v_4(n') \tag{32}$$

Accordingly, the partial sums u for both the I- and Q-phase may be generated as shown in Table 1:

TABLE 1

| $k_i$ | Odd | | Even | |
| --- | --- | --- | --- | --- |
| $k_i$ mod 4 | 1 | 3 | 2 | 4 |
| $u_{I,0}$ | $v_0(n')$ | | $v_0(n') - v_4(n')$ | $v_0(n') + v_4(n')$ |
| $u_{I,1}$ | $v_1(n') - v_7(n')$ | | $v_1(n') + v_7(n')$ | |
| $u_{I,2}$ | $v_2(n') - v_6(n')$ | | $v_2(n') + v_6(n')$ | |
| $u_{I,P-1}$ | $v_3(n') - v_5(n')$ | | $v_3(n') + v_5(n')$ | |
| $k_i$ mod 4 | 1 | 3 | 2 | 4 |
| $u_{Q,0}$ | $v_4(n')$ | $-v_4(n')$ | 0 | |
| $u_{Q,1}$ | $v_1(n') + v_7(n')$ | | $v_1(n') - v_7(n')$ | |
| $u_{Q,2}$ | $v_2(n') + v_6(n')$ | | $v_2(n') - v_6(n')$ | |
| $u_{Q,P-1}$ | $v_3(n') + v_5(n')$ | | $v_3(n') - v_5(n')$ | |

Figure 9A:
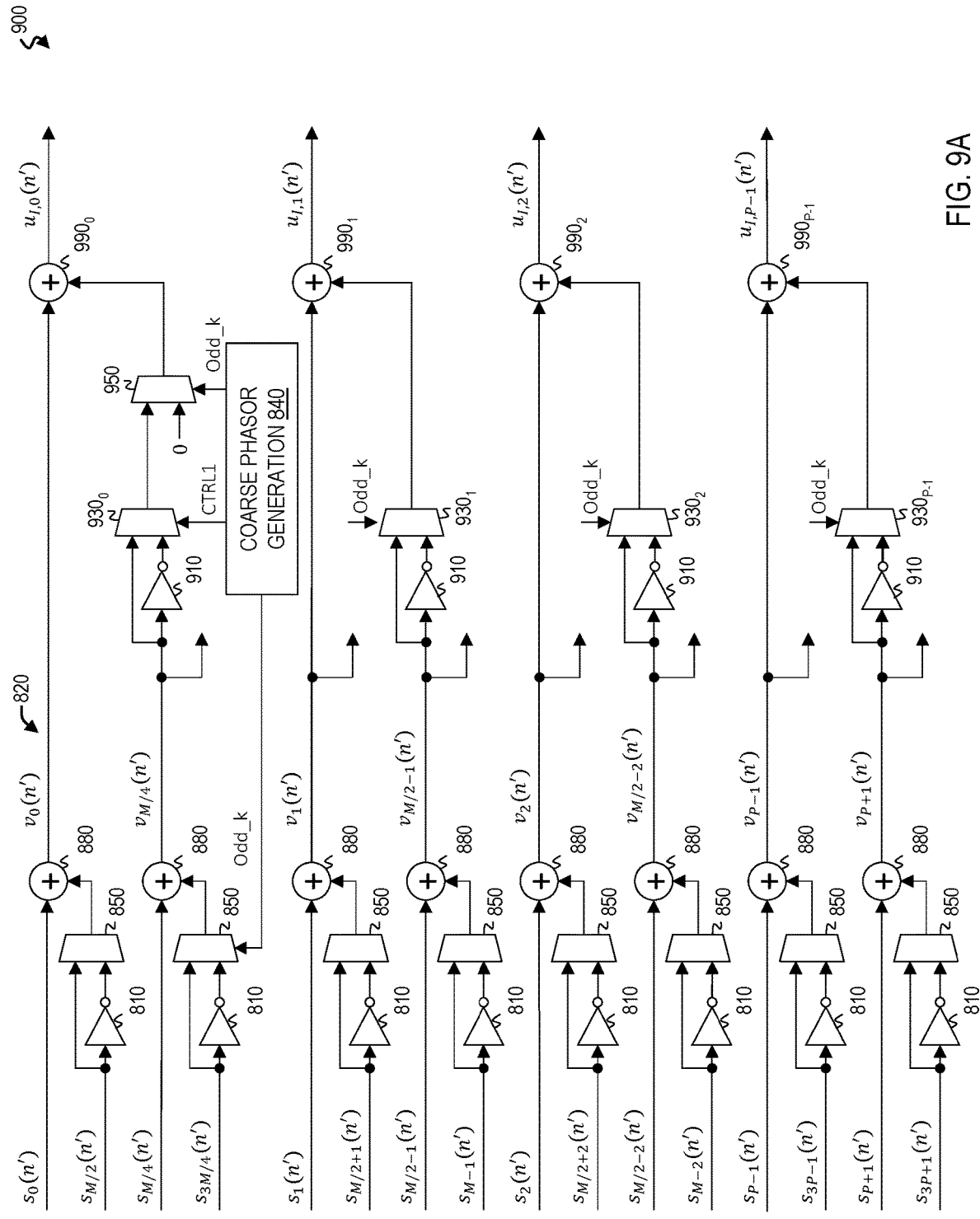
FIGS. 9A and 9B are circuit diagrams of a pre-combiner according to an illustrative embodiment.
Figure 9B:
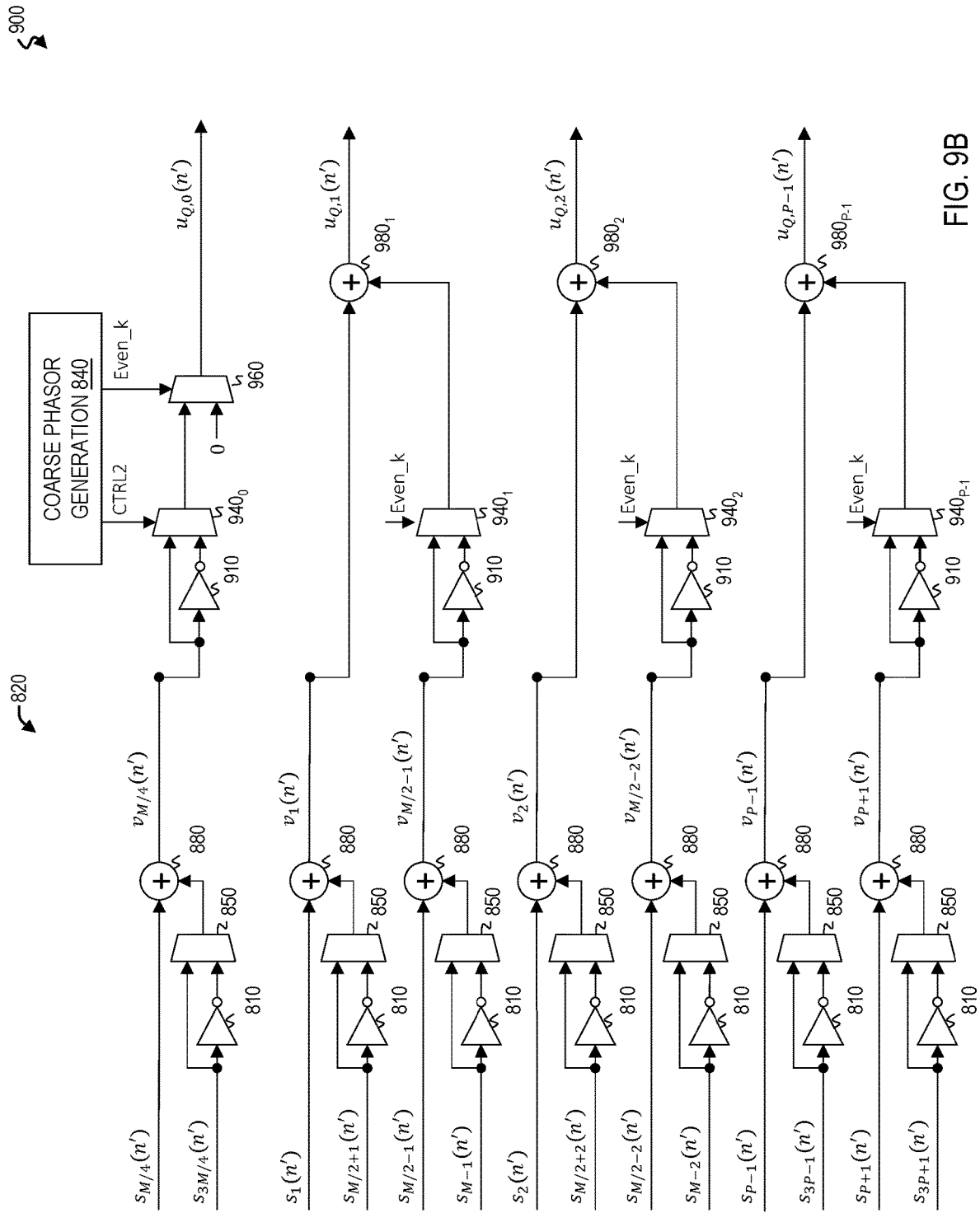

FIGS. 9A and 9B are diagrams of a two-stage pre-combiner 900 according to an illustrative embodiment. In the embodiment of FIGS. 9A and 9B, the pre-combiner 900 includes the single-stage pre-combiner 820, which combines the M subfilter outputs $s_m(n')$ into M/2 subfilter outputs $v_m(n')$ as described above with reference to FIGS. 8A and 8B. Instead of multiplying each of the M/2 subfilter outputs $v_m(n')$ by a complex phasor, the pre-combiner 900 combines the M/2 subfilter outputs $v_m(n')$ into P=M/4 partial sums for the I-phase signal (as shown in FIG. 9A) and the Q-phase signal (as shown in FIG. 9B).

As shown in FIG. 9A, to generate the P partial sums $u_{I,1}(n')$ through $u_{I,P-1}(n')$ for the I-phase signal, the pre-combiner 900 includes P adders $990_0$ through $990_{P-1}$, which each have a first input that receives one of the subfilter outputs $v_0(n')$ through $v_{P-1}(n')$ and a second input coupled to the output of one of P multiplexers $930_0$ through $930_{P-1}$. The adder $990_0$ that generates the partial sum $u_{I,0}(n')$ is coupled to the multiplexer $930_0$ via a second multiplexer 950, which has a first input coupled to the output of the multiplexer $930_0$ and a second input that receives a value of 0. Each of the multiplexers $930_0$-$930_{P-1}$ has two inputs that each receive one of the other subfilter outputs $v_m(n')$ either directly or via an inverter 910.

To generate the partial sums $u_{I,1}(n')$ through $u_{I,P-1}(n')$, the coarse phasor generation circuitry 840 outputs a control signal Odd_k to the multiplexers $930_1$, $930_2$, and $930_3$ depending on whether $k_i$ is even or odd. If $k_i$ is even, Odd_k has a value of 0 (e.g. a logic "0" or a logic low) and $u_{I,1}(n')$ through $u_{I,P-1}(n')$ are generated by adding two subfilter outputs $v_m(n')$. If $k_i$ is odd, Odd_k has a value of 1 (e.g. a logic "1" or a logic high) and $u_{I,1}(n')$ through $u_{I,P-1}(n')$ are generated by subtracting two subfilter outputs $v_m(n')$. The control signal Odd_k is also output to the additional multiplexer 950. If $k_i$ is odd, Odd_k has a value of 1, the additional multiplexer 950 selects 0, and the partial sum $u_{I,0}(n')$ is $v_0(n')$. If $k_i$ is even, Odd_k has a value of 0, the additional multiplexer 950 selects the output of the multiplexer $930_0$ and, depending on the input selected by the $930_0$, the partial sum $u_{I,0}(n')$ is either $v_0(n')+v_{M/4}(n')$ or $v_0(n')-v_{M/4}(n')$. To select either $v_0(n')+v_{M/4}(n')$ or $v_0(n')-v_{M/4}(n')$, the coarse phasor generation circuitry 840 outputs a control signal CTRL1 to the multiplexer $930_0$. If $k_i$ is divisible by 4, CTRL1 has a value of 0, the multiplexer $930_0$ selects $v_{M/4}(n')$, and the partial sum $u_{I,0}(n')$ is $v_0(n')+v_{M/4}(n')$. If $k_i$ is not divisible by 4, CTRL1 has a value of 1, the multiplexer $930_0$ selects the output of the inverter 910, and (provided $k_i$ is not odd) the partial sum $u_{I,0}(n')$ is $v_0(n')-v_{M/4}(n')$.

As shown in FIG. 9B, to generate the P−1 partial sums $u_{Q,1}(n')$ through $u_{Q,P-1}(n')$ for the Q-phase signal, the pre-combiner 900 also includes P−1 adders $980_1$ through $980_{P-1}$, which each have a first input that receives one of the subfilter outputs $v_1(n')$ through $v_{P-1}(n')$. The pre-combiner 900 also includes P multiplexers $940_0$ through $940_{P-1}$ that each receive one of the other subfilter outputs $v_m(n')$ either directly or via an inverter 910. To generate the partial sum $u_{Q,0}(n')$, the output of the multiplexer $940_0$ is coupled to a first input of an additional multiplexer 960, which has a second input that receives a value of 0.

To generate the partial sums $u_{Q,1}(n')$ through $u_{Q,P-1}(n')$, the coarse phasor generation circuitry 840 outputs a control signal Even_k to the multiplexers $940_1$, $940_2$, and $940_3$ depending on whether $k_i$ is even or odd. If $k_i$ is odd, Even_k has a value of 0 and $u_{Q,1}(n')$ through $u_{Q,P-1}(n')$ are generated by adding two subfilter outputs $v_m(n')$. If $k_i$ is even, Even_k has a value of 1 and $u_{Q,1}(n')$ through $u_{Q,P-1}(n')$ are generated by subtracting two subfilter outputs $v_m(n')$. The control signal Even_k is also output to the additional multiplexer 960. If $k_i$ is even, Even_k has a value of 1, the additional multiplexer 960 selects 0, and the partial sum $u_{Q,0}(n')$ is 0. If $k_i$ is odd, Even_k has a value of 0, the additional multiplexer 960 selects the output of the multiplexer $940_0$, and, depending on the input selected by the $940_0$, the partial sum $u_{Q,0}(n')$ is either $v_{M/4}(n')$ or $-v_{M/4}(n')$. The coarse phasor generation circuitry 840 outputs a control signal CTRL2 to the multiplexer $940_0$. If $k_i$ mod 4=3 (e.g., $k_i=3$), CTRL2 has a value of 1, the multiplexer $930_0$ selects the output of the inverter 910, and the partial sum $u_{Q,0}(n')$ is $-v_{M/4}(n')$. If $k_i$ mod 4 is not equal to 3 but $k_i$ is still odd (i.e., $k_i$ is 1, 5, 9.

etc.), CTRL2 has a value of 0, the multiplexer $930_0$ selects $v_{M/4}(n')$, and the partial sum $u_{Q,0}(n')$ is $v_{M/4}(n')$.

Figure 10:
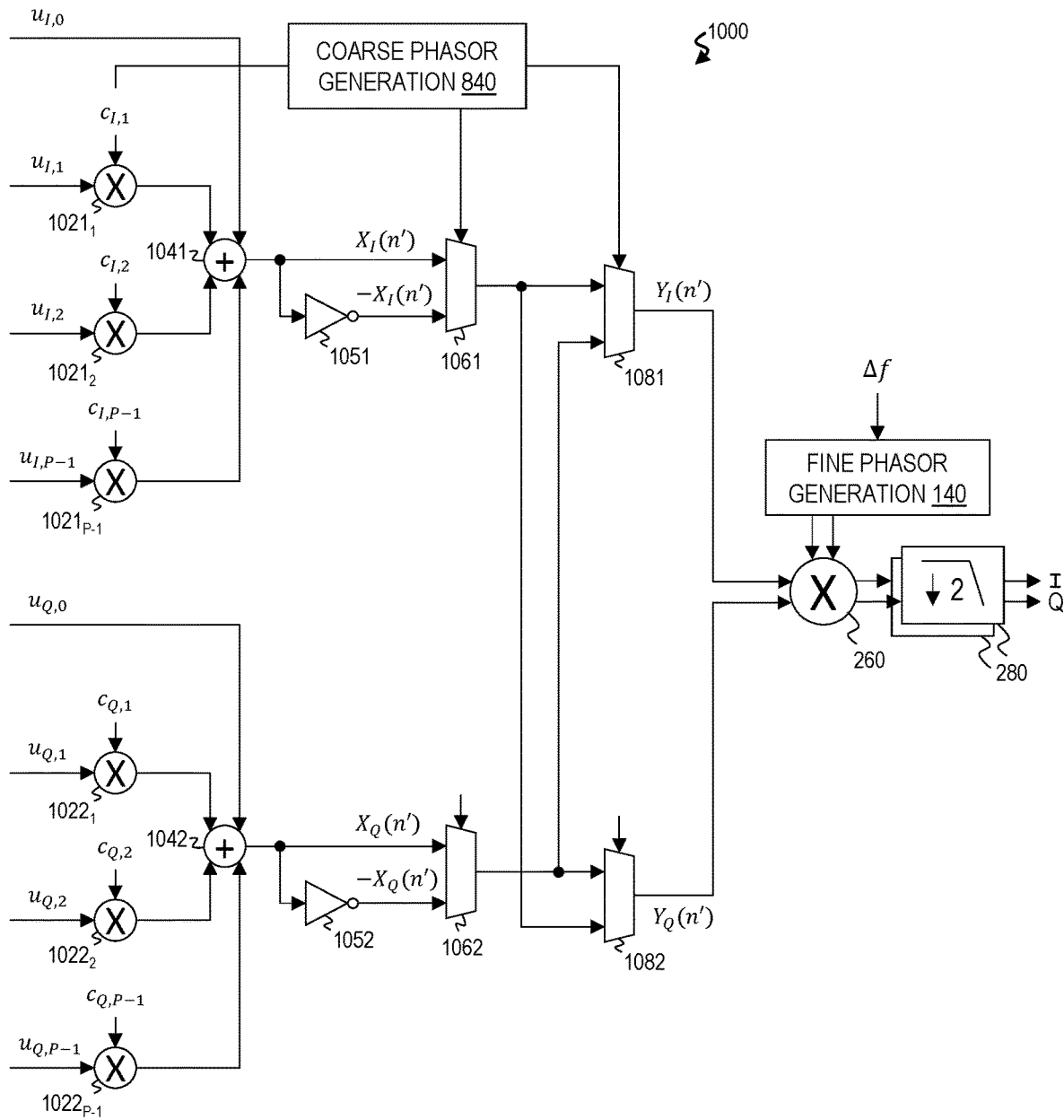
FIG. 10 is a circuit diagram of a phasor multiply and add module according to an illustrative embodiment.

FIG. 10 is a schematic diagram of a phasor multiply and add module 1000 according to an illustrative embodiment. As described above with reference to FIGS. 8C-8G, each of the partial sums u are multiplied by one of a limited number of real multiplicands: 0, ±1, ±$c_1$, ±$c_2$, or ±$c_3$, where $c_1$=cos(π/8), $c_2$=cos(π/4), and $c_3$=cos(3π/8). Accordingly, in the embodiment of FIG. 10, the phasor multiply and add module 1000 includes P−1 multipliers $1021_1$ through $1021_{P-1}$ (individually and collectively referred to as multipliers 1021) that each multiply one of the partial sums $u_{I,1}(n')$ through $u_{I,P-1}(n')$ by the required real multiplicand $c_{I,1}$, $c_{I,2}$, or $c_{I,3}$ (output by the coarse phasor generation circuitry 840) and an adder 1041 that sums the output of the P−1 multipliers 1021 and the partial sum $u_{I,0}(n')$ to form an I-phase sum $X_I(n')$. The phasor multiply and add module 1000 also includes P−1 multipliers $1022_1$ through $1022_{P-1}$ (individually and collectively referred to as multipliers 1021) that each multiply one of the partial sums $u_{Q,1}(n')$ through $u_{Q,P-1}(n')$ by the required real multiplicand $c_{Q,1}$, $c_{Q,2}$, or $c_{Q,3}$ (output by the coarse phasor generation circuitry 840) and an adder 1042 that sums the output of the P−1 multipliers 1022 and the partial sum $u_{Q,0}(n')$ to form a Q-phase sum $X_Q(n')$.

As described above with reference to equation 15, the I- and Q-phase sums $X_I(n')$ and $X_Q(n')$ must be multiplied by a second complex phasor sub-term $$\exp\left\{\frac{-j2\pi k_i n}{4}\right\}.$$

Accordingly, the multiply and add module 1000 generates the I-phase output signal $Y_I(n')$ and the Q-phase output signal $Y_Q(n')$ by computing $$\{X_I(n') + jX_Q(n')\} * \exp\left\{\frac{-j2\pi k_i n}{4}\right\}.$$

However, $$\exp\left\{\frac{-j2\pi k_i n}{4}\right\}$$

takes one of at most 4 values, {1, j, −1, −j}, as a function of the sample index n, and can be performed as a "post-rotation" operation as described below.

The value of $$\exp\left\{\frac{-j2\pi k_i n}{4}\right\}$$

can be determined by calculating (−$k_i$*n) mod 4, which has four possible values as shown in Table 2:

TABLE 2

| (−$k_i$ * n) mod 4 | $\exp\left\{\frac{-j2\pi k_i n}{4}\right\}$ |
|---|---|
| 0 | 1 |
| 1 | j |

TABLE 2-continued

| (−$k_i$ * n) mod 4 | $\exp\left\{\frac{-j2\pi k_i n}{4}\right\}$ |
|---|---|
| 2 | −1 |
| 3 | −j |

The I- and Q-phase output signals $Y_I(n')$ and $Y_Q(n')$ can then be determined by selecting and/or negating the I- and Q-phase sums $X_I(n')$ and $X_Q(n')$ as shown in Table 3:

TABLE 3

| Post-Rotation Value | $Y_I(n')$ | $Y_Q(n')$ |
|---|---|---|
| 1 | $X_I(n')$ | $X_Q(n')$ |
| j | −$X_Q(n')$ | $X_I(n')$ |
| −1 | −$X_I(n')$ | −$X_Q(n')$ |
| −j | $X_Q(n')$ | −$X_I(n')$ |

The I- and Q-phase output signals $Y_I(n')$ and $Y_Q(n')$ can then be generated using multiplexers and negations. The embodiment of FIG. 10, for instance, includes two inverters 1051 and 1052 and four multiplexers 1061, 1062, 1081, and 1082. The multiplexer 1081, which outputs the I-phase output signal $Y_I(n')$, has a first input coupled to the output of the multiplexer 1061 and a second input coupled to the output of the multiplexer 1062. The multiplexer 1082, which outputs the Q-phase output signal $Y_Q(n')$, has a first input coupled to the output of the multiplexer 1061 and a second input coupled to the output of the multiplexer 1062. The multiplexer 1061 has a first input that receives the I-phase sum $X_I(n')$ from the adder 1041 and a second input that receives the inverted I-phase sum −$X_I(n')$ from the adder 1041 via the inverter 1051. The multiplexer 1062 has a first input that receives the Q-phase sum $X_Q(n')$ from the adder 1042 and a second input that receives the inverted Q-phase sum −$X_Q(n')$ from the adder 1042 via the inverter 1052. Therefore, in the embodiment of FIG. 10, the coarse phasor generator 840 can perform the post rotation operation by calculating −$k_i$*n mod 4 and outputting control signals to the multiplexers 1061, 1062, 1081, and 1082 to select the appropriate sums $X_I(n')$, $X_Q(n')$, −$X_I(n')$, or −$X_Q(n')$ to output as the I- and Q-phase output signals $Y_I(n')$ and $Y_Q(n')$.

In the embodiment of FIG. 10, the phasor multiply and add module 1000 outputs the I- and Q-phase output signals $Y_I(n')$ and $Y_Q(n')$ to the fine mixer 260, which shifts the down-converted signal by a residual amount Δf (by mixing the down-converted signal with phasors generated by the fine phasor generation circuitry 140). In the embodiment of FIG. 10, the signal centered around DC output by the fine mixer 140 is further decimated by additional decimation filters 280.

Figure 11:
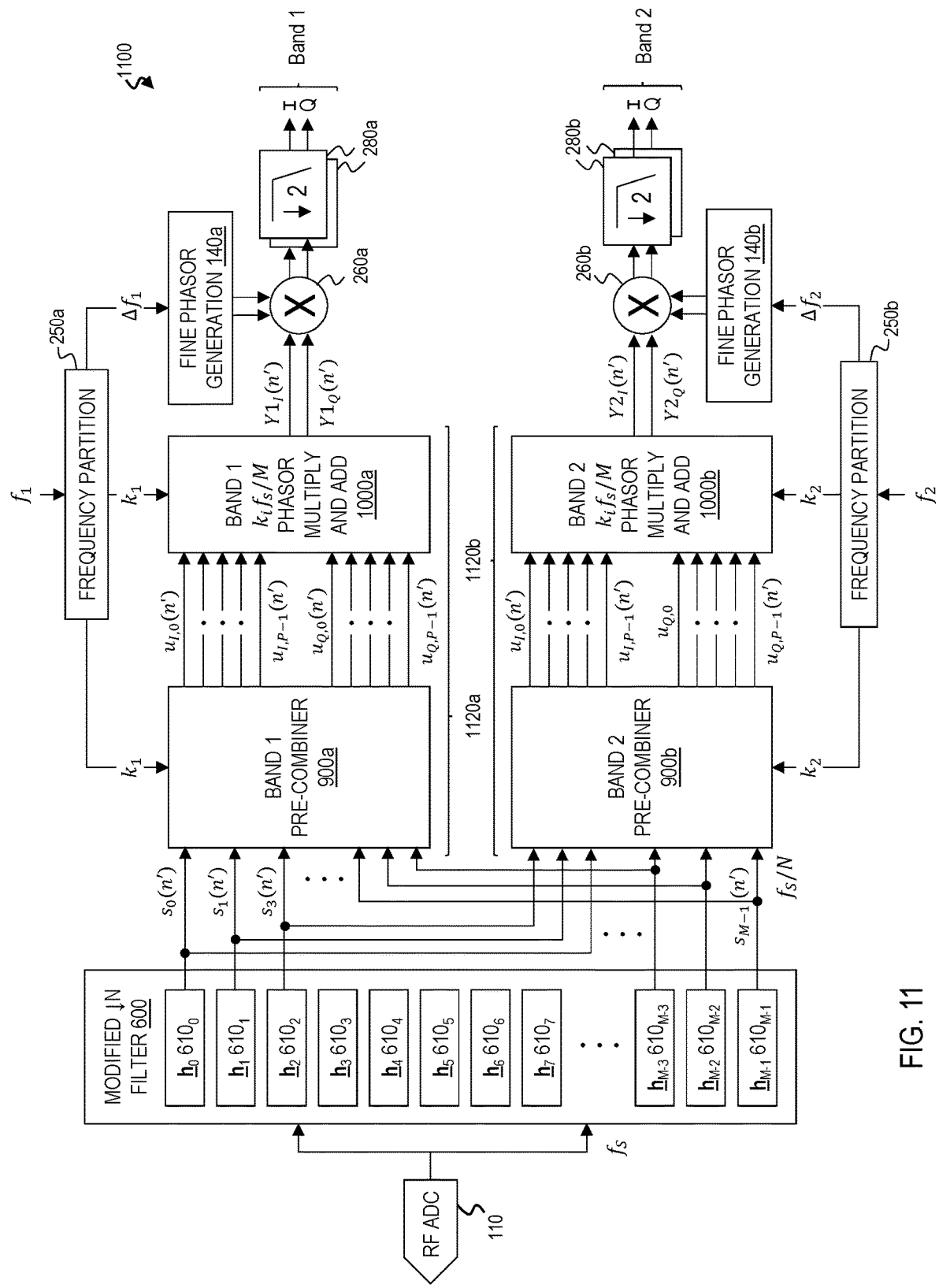
FIG. 11 is a block diagram of a DDC according to an illustrative embodiment.

FIG. 11 is a block diagram of a DDC 1100 according to an illustrative embodiment. In the embodiment of FIG. 11, the DDC 1100 is a dual-band digital down-converter that receives a digital signal from the ADC 110 with two desired signal components in two frequency bands centered around two center frequencies $f_1$ and $f_2$. While two bands are illustrated in this embodiment, DDC 1100 may be scaled to accommodate more (or fewer) bands in other embodiments.

In the embodiment of FIG. 11, the DDC 1100 includes the modified decimate-by-N filter 600 described above with reference to FIG. 6, which filters and decimates the input samples r(n) received from the ADC 110 to generate M subfilter outputs $s_m(n')$.

For each of the two frequency bands, the DDC 1100 includes frequency partition circuitry 250a and 250b. The frequency partitioning circuitry 250a selects the integer $k_1$ wherein the coarse frequency $f_{C1}=k_1 f_s/M$ is closest to the center frequency $f_1$ of the first frequency band. Similarly, the frequency partitioning circuitry 250b for the second frequency band selects the integer $k_2$ wherein $f_{c2}=k_2 f_s/M$ is closest to the center frequency $f_2$ of the second frequency band.

The DDC 1100 includes two pre-combiners 900a and 900b (one for each of the two frequency bands) described above with reference to FIGS. 9A and 9B. Each pre-combiner 900a and 900b receives the M subfilter outputs $s_m(n')$ output by the modified decimate-by-N filter 600. Using the process described above for the frequency index $k_1$ of the first band, pre-combiner 900a combines the M subfilter outputs $s_m(n')$ to generate P partial sums $u_{I,0}(n')$ through $u_{I,P-1}(n')$ for the I-phase and P partial sums $u_{Q,0}(n')$ through $u_{Q,P-1}(n')$ for the Q-phase. Using the process described above for the frequency index $k_2$ of the second band, the pre-combiner 900b combines the M subfilter outputs $s_m(n')$ to generate P partial sums $u_{I,0}(n')$ through $u_{I,P-1}(n')$ for the I-phase and P partial sums $u_{Q,0}(n')$ through $u_{Q,P-1}(n')$ for the Q-phase.

The DDC 1100 includes two phasor multiply and add modules 1000a and 1000b (one for each of the two frequency bands). The phasor multiply and add module 1000a for the first frequency band receives the partial sums $u_{I,0}(n')$ through $u_{I,P-1}(n')$ and $u_{Q,0}(n')$ through $u_{Q,P-1}(n')$ output by the pre-combiner 900a for the first frequency band and generates I- and Q-phase signals $Y1_I(n')$ and $Y1_Q(n')$ for the first frequency band. The phasor multiply and add module 1000b for the second frequency band receives the partial sums $u_{I,0}(n')$ through $u_{I,P-1}(n')$ and $u_{Q,0}(n')$ through $u_{Q,P-1}(n')$ output by the pre-combiner 900b for the second frequency band and generates I- and Q-phase signals $Y2_I(n')$ and $Y2_Q(n')$ for the second frequency band. As described above with reference to FIG. 10, each phasor multiply and add module 1000 generates the I- and Q-phase signals $Y_I(n')$ and $Y_Q(n')$ by multiplying each of the partial sums $u_{I,1}(n')$-$u_{I,P-1}(n')$ and $u_{Q,1}(n')$-$u_{Q,P-1}(n')$ by the required real multiplicand, summing the phasor-term-multiplied partial sums $u_{I,0}(n')$-$u_{I,P-1}(n')$ and $u_{Q,0}(n')$-$u_{Q,P-1}(n')$ to generate signals $X_I(n')$ and $X_Q(n')$, and performing a post-rotation operation on the signals $X_I(n')$ and $X_Q(n')$.

Together, the pre-combiner 900a and the phasor multiply and add module 1000a form a coarse mixer 1120a that down-converts the signal received from the ADC 110 by the coarse frequency $f_{C1}=k_1 f_s/M$. Similarly, the pre-combiner 900b and the phasor multiply and add module 1000b form a coarse mixer 1120b that down-converts the signal received from the ADC 110 by the coarse frequency $f_{C2}=k_2 f_s/M$. The coarse mixers 1120a and 1120b are individually and collectively referred to as coarse mixers 1120. In the embodiments described above, the novel coarse mixers 1120 are more efficient than the prior art coarse mixers 220 of the two-stage DDC 200 (and much more efficient than the single-stage mixer 160 of the single-stage DDC 120). While each prior art coarse mixer 220 of the prior art two-stage DDC 200 is required to perform M multiplication operations using M complex phasors, the novel coarse mixers 1120 are only required to perform P−1 multiplication operations for each of the I- and Q-phases using real multiplicands.

The phasor multiply and add module 1000a for the first band outputs the I- and Q-phase output signals $Y1_I(n')$ and $Y1_Q(n')$ to the fine mixer 260a, which shifts the down-converted signal by a residual amount $\Delta f_1$ (by mixing the down-converted signal with phasors generated by the fine phasor generation circuitry 140a). The phasor multiply and add module 1000b for the second band outputs the I- and Q-phase output signals $Y2_I(n')$ and $Y2_Q(n')$ to the fine mixer 260b, which shifts the down-converted signal by a residual amount $\Delta f_2$ (by mixing the down-converted signal with phasors generated by the fine phasor generation circuitry 140b). In the embodiment of FIG. 11, the signal centered around DC output by the fine mixer 140a is further decimated by additional decimation filters 280a and the signal centered around DC output by the fine mixer 140b is further decimated by additional decimation filters 280b.

As described in detail above, the DDC 1100 improves the efficiency of the prior art two-stage DDC 200 and single-stage DDC 120.

While embodiments are described above in connection with a wireless base station receiver, the embodiments described above are not so limited and may be used in a variety of other systems.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, one or more structures/devices may be formed on different semiconductor substrates or they may be formed within a single physical device (e.g., a semiconductor substrate and/or integrated circuit (IC) package). Circuits described herein are reconfigurable to include the replaced components to provide functionality at least partially similar to functionality available prior to the component replacement.

In some example embodiments, certain elements may be included in an integrated circuit while other elements are external to the integrated circuit. In other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are:

(i) incorporated in/over a semiconductor substrate; (ii) incorporated in a single semiconductor package; (iii) incorporated into the same module; and/or (iv) incorporated in/on the same printed circuit board.

While some example embodiments may implement certain elements in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. A digital down converter (DDC) operable to down-convert a received signal having a frequency band of interest centered around a center frequency, the DDC comprising:
    a decimation filter including a plurality of multipliers, each multiplier operable to filter an input sample by a filter coefficient, the plurality of multipliers being arranged to form a plurality of subfilters, each subfilter being operable to generate a subfilter output;
    frequency partition circuitry operable to identify an integer based on the center frequency;
    a coarse mixer, coupled to the decimation filter and the frequency partition circuitry, operable to down-convert the subfilter outputs by a coarse frequency proportional to the integer; and
    a fine mixer, coupled to the coarse mixer and the frequency partition circuitry, operable to shift the down-converted subfilter outputs from the coarse mixer by a residual frequency difference.

2. The DDC of claim 1, wherein the received signal has a second frequency band of interest centered around a second center frequency, the DDC further comprising:
    second frequency partition circuitry operable to identify a second integer based on the second center frequency;
    a second coarse mixer, coupled to the decimation filter and the second frequency partition circuitry, operable to down-convert the subfilter outputs by a second coarse frequency that is proportional to the second integer; and
    a second fine mixer, coupled to the second coarse mixer and the second frequency partition circuitry, operable to shift the down-converted subfilter outputs from the second coarse mixer by a second residual frequency difference.

3. The DDC of claim 1, wherein:
    the received signal has a sampling rate of $f_s$;
    the coarse mixer has an equivalent frequency resolution of $f_s*M$ where M is an integer;
    the coarse frequency $f_{C1}$ is equal to $k_1 f_s/M$, where $f_1$ is the center frequency of the frequency band of interest;
    the frequency partition circuitry is operable to identify the integer $k_1$, wherein the coarse frequency $f_{C1}$ is closest to the center frequency $f_1$;
    the decimation filter is a decimate-by-N filter that includes L multipliers, each of the L multipliers being operatable to filter one of the L most recent input samples by one of L filter coefficients;
    the L multipliers of the decimate-by-N filter are arranged to form the M subfilters, each of the M subfilters including up to L/M of the L multipliers;
    each of the M subfilters are operable to generate a subfilter output for every N input samples of the received signal; and
    the residual frequency difference $\Delta f_1$ is equal to $f_1 - f_{C1}$.

4. The DDC of claim 3, wherein the coarse mixer comprises:
    a pre-combiner operable to combine the M subfilter outputs into P in-phase partial sums and P quadrature partial sums, where P=M/4; and
    a phasor multiply and add module operable to generate an in-phase output signal and a quadrature output signal by:
        generating P in-phase phasor-term-multiplied partial sums by multiplying at least some of the P in-phase partial sums by real multiplicands;
        summing the in-phase phasor-term-multiplied partial sums to form an in-phase sum;
        generating P quadrature phasor-term-multiplied partial sums by multiplying at least some of the P quadrature partial sums by real multiplicands;
        summing the quadrature phasor-term-multiplied partial sums to form a quadrature sum; and
        multiplying the in-phase sum and the quadrature sum by a complex phasor sub-term.

5. The DDC of claim 4, wherein the pre-combiner is operable to:
    combine the M subfilter outputs output by the decimate-by-N filter into M/2 combined subfilter outputs in accordance with a determination of whether $k_1$ is an even number or an odd number;
    generate the P in-phase partial sums by combining the M/2 combined subfilter outputs in accordance with the determination of whether $k_1$ is an even number or an odd number and a second determination of whether $k_1$ is divisible by 4; and
    generate the P quadrature partial sums by combining the M/2 combined subfilter outputs in accordance with the determination of whether $k_1$ is an even number or an odd number and a second determination of whether $k_1$ mod 4 is 1 or 3.

6. The DDC of claim 4, wherein the real multiplicands have a magnitude equal to $\cos(\pi/8)$, $\cos(\pi/4)$, or $\cos(3\pi/8)$.

7. The DDC of claim 4, wherein the complex phasor sub-term is selected from among a set of four predetermined values that includes 1, j, −1, and −j.

8. The DDC of claim 7, wherein the phasor multiply and add module multiplies the in-phase sum and the quadrature sum by the complex phasor sub-term by performing a post-rotation operation.

9. The DDC of claim 8, wherein the phasor multiply and add module performs the post-rotation operation by inverting the in-phase sum, inverting the quadrature sum, and selecting the in-phase output signal and the quadrature output signal from among the in-phase sum, the inverted in-phase sum, the quadrature sum, and the inverted quadrature sum.

10. A method of down-converting a received signal having a frequency band of interest centered around a center frequency, the method comprising:
    filtering and decimating input samples of the received signal, by a decimation filter comprising a plurality of multipliers, each multiplier operable to filter an input sample of the received signal by a filter coefficient, the plurality of multipliers being arranged to form a plurality of subfilters;
    generating a subfilter output by each subfilter of the decimation filter;
    identifying, by a frequency partition circuit, an integer based on the center frequency;
    down-converting, by a course mixer, the subfilter outputs by a coarse frequency that is proportional to the integer to form a coarse mixed signal; and
    shifting a frequency of the coarse mixed signal by a residual frequency difference.

11. The method of claim 10, wherein the received signal has a second frequency band of interest centered around a second center frequency, the method further comprising:
    identifying a second integer based on the second center frequency;
    down-converting the subfilter outputs by a second coarse frequency that is proportional to the second integer to form a second coarse mixed signal; and
    shifting the second coarse mixed signal by a second residual frequency difference.

12. The method of claim 10, wherein:
    the received signal has a sampling rate of $f_s$;
    the coarse mixer has an equivalent frequency resolution of $f_s*M$ where M is an integer;
    the coarse frequency $f_{C1}$ is equal to $k_1 f_s/M$, where $f_1$ is the center frequency of the frequency band of interest;
    the frequency partition circuitry is operable to identify the integer $k_1$, wherein the coarse frequency $f_{C1}$ is closest to the center frequency $f_1$;
    the residual frequency difference $\Delta f_1$ is equal to $f_1 - f_{C1}$;
    the decimation filter is a decimate-by-N filter that includes L multipliers, each of the L multipliers being operatable to filter one of the L most recent input samples by one of L filter coefficients;
    the L multipliers of the decimate-by-N filter are arranged to form the M subfilters, each of the M subfilters including up to L/M of the L multipliers; and
    each of the M subfilters are operable to generate a subfilter output for every N input samples of the received signal.

13. The method of claim 12, wherein down-converting the subfilter outputs by the coarse frequency $f_{C1}$ comprises:
    combining the M subfilter outputs into P in-phase partial sums and P quadrature partial sums, where P=M/4;
    generating P in-phase phasor-term-multiplied partial sums by multiplying at least some of the P in-phase partial sums by real multiplicands;
    summing the in-phase phasor-term-multiplied partial sums to form an in-phase sum;
    generating P quadrature phasor-term-multiplied partial sums by multiplying at least some of the P quadrature partial sums by real multiplicands;
    summing the quadrature phasor-term-multiplied partial sums to form a quadrature sum; and
    generating an in-phase output signal and a quadrature output signal by multiplying the in-phase sum and the quadrature sum by a complex phasor sub-term.

14. The method of claim 13, wherein combining the M subfilter outputs into P in-phase partial sums and P quadrature partial sums comprises:
    combining the M subfilter outputs output by the decimate-by-N filter into M/2 combined subfilter outputs in accordance with a determination of whether $k_1$ is an even number or an odd number;
    generating the P in-phase partial sums by combining the M/2 combined subfilter outputs in accordance with the determination of whether $k_1$ is an even number or an odd number and a second determination of whether $k_1$ is divisible by 4; and
    generating the P quadrature partial sums by combining the M/2 combined subfilter outputs in accordance with the determination of whether $k_1$ is an even number or an odd number and a second determination of whether $k_1$ mod 4 is 1 or 3.

15. The method of claim 13, wherein the real multiplicands have a magnitude equal to $\cos(\pi/8)$, $\cos(\pi/4)$, or $\cos(3\pi/8)$.

16. The method of claim 13, wherein the complex phasor sub-term is selected from among a set of four predetermined values that includes 1, j, −1, and −j.

17. The method of claim 16, wherein multiplying the in-phase sum and the quadrature sum by the complex phasor sub-term comprises performing a post-rotation operation.

18. The method of claim 17, wherein performing the post-rotation operation comprises:
    inverting the in-phase sum;
    inverting the quadrature sum; and
    selecting the in-phase output signal and the quadrature output signal from among the in-phase sum, the inverted in-phase sum, the quadrature sum, and the inverted quadrature sum.

19. A system operable to down-convert a received signal having a first frequency band of interest centered around a first center frequency and a second frequency band of interest centered around a second center frequency, the system comprising:
    a decimation filter comprising a plurality of multipliers, each multiplier operable to filter an input sample by a filter coefficient, the plurality of multipliers being arranged to form a plurality of subfilters, each subfilter being operable to generate a subfilter output;
    frequency partition circuitry operable to identify a first integer based on the first center frequency and a second integer based on the second center frequency;
    a first coarse mixer, coupled to the decimation filter and the frequency partition circuitry, operable to down-convert the subfilter outputs by a first coarse frequency that is proportional to the first integer;
    a first fine mixer, coupled to the first coarse mixer and the frequency partition circuitry, operable to shift the down-converted subfilter outputs from the first coarse mixer a first residual frequency difference;
    a second coarse mixer, coupled to the decimation filter and the frequency partition circuitry, operable to down-convert the subfilter outputs by a second coarse frequency that is proportional to the second integer; and
    a second fine mixer, coupled to the second coarse mixer and the frequency partition circuitry, operable to shift the down-converted subfilter outputs from the second coarse mixer by a second residual frequency difference.

20. The system of claim 19, wherein:
the received signal has a sampling rate of $f_s$;
the first coarse mixer and the second coarse mixer have an equivalent frequency resolution of $f_s*M$ where M is an integer;
the first coarse frequency $f_{C1}$ is equal to $k_1 f_s/M$ and the second coarse frequency $f_{C2}$ is equal to $k_2 f_s/M$, where $f_1$ is the first center frequency of the first frequency band of interest and $f_2$ is the second center frequency of the second frequency band of interest;
the frequency partition circuitry is operable to identify the first integer $k_1$, wherein the first coarse frequency $f_{C1}$ is closest to the first center frequency $f_1$ and the second integer $k_2$ wherein the second course coarse frequency $f_{C2}$ is closest to the second center frequency $f_2$;
the first residual frequency difference $\Delta f_1$ is equal to $f_1 - f_{C1}$ and the second residual frequency difference $\Delta f_2$ is equal to $f_2 - f_{C2}$;
the decimation filter is a decimate-by-N filter that includes L multipliers, each of the L multipliers being operatable to filter one of the L most recent input samples by one of L filter coefficients;
the L multipliers of the decimate-by-N filter are arranged to form the M subfilters, each of the M subfilters including up to L/M of the L multipliers; and
each of the M subfilters are operable to generate a subfilter output for every N input samples of the received signal.

21. The system of claim 20, wherein each of the first coarse mixer and the second coarse mixer comprises:
a pre-combiner operable to:
combine the M subfilter outputs output by the decimate-by-N filter into M/2 combined subfilter outputs for the respective first or second frequency band of interest in accordance with a determination of whether $k_1$ or $k_2$ is an even number or an odd number;
generate P in-phase partial sums for the respective first or second frequency band of interest, where P=M/4, by combining the M/2 combined subfilter outputs for the respective first or second frequency band of interest in accordance with the determination of whether $k_1$ or $k_2$ is an even number or an odd number and a second determination of whether $k_1$ or $k_2$ is divisible by 4; and
generate the P quadrature partial sums for the respective first or second frequency band of interest by combining the M/2 combined subfilter outputs for the respective first or second frequency band of interest in accordance with the determination of whether $k_1$ is an even number or an odd number and a second determination of whether $k_1$ mod 4 is equal to 1 or 3; and
a phasor multiply and add module operable to:
generate P in-phase phasor-term-multiplied partial sums for the respective first or second frequency band of interest by multiplying at least some of the P in-phase partial sums for the respective first or second frequency band of interest by real multiplicands;
sum the in-phase phasor-term-multiplied partial sums for the respective first or second frequency band of interest to form an in-phase sum for the respective first or second frequency band of interest;
generate P quadrature phasor-term-multiplied partial sums for the respective first or second frequency band of interest by multiplying at least some of the P quadrature partial sums for the respective first or second frequency band of interest by real multiplicands;
sum the quadrature phasor-term-multiplied partial sums for the respective first or second frequency band of interest to form a quadrature sum for the respective first or second frequency band of interest;
invert the in-phase sum for the respective first or second frequency band of interest;
invert the quadrature sum for the respective first or second frequency band of interest; and
select an in-phase output signal and a quadrature output signal sum for the frequency band of interest from among the in-phase sum for the respective first or second frequency band of interest, the inverted in-phase sum for the respective first or second frequency band of interest, the quadrature sum for the respective first or second frequency band of interest, and the quadrature sum for the respective first or second frequency band of interest.

\* \* \* \* \*